(12) United States Patent
Sugama

(10) Patent No.: US 8,508,099 B2
(45) Date of Patent: Aug. 13, 2013

(54) PACKAGE MANUFACTURING METHOD, PACKAGE, PIEZOELECTRIC VIBRATOR, OSCILLATOR, ELECTRONIC DEVICE AND RADIO TIMEPIECE

(75) Inventor: Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 144 days.

(21) Appl. No.: 13/204,278

(22) Filed: Aug. 5, 2011

(65) Prior Publication Data
US 2011/0291523 A1  Dec. 1, 2011

Related U.S. Application Data

(63) Continuation of application No. PCT/JP2009/053336, filed on Feb. 25, 2009.

(51) Int. Cl.
*H01L 41/22* (2006.01)
*H01L 41/053* (2006.01)
*H03H 9/15* (2006.01)

(52) U.S. Cl.
USPC ........... 310/311; 310/340; 29/25.35; 331/155

(58) Field of Classification Search
USPC ........ 310/311, 340, 344; 29/25.35; 368/155, 368/156, 159, 160, 168; 331/154, 155
See application file for complete search history.

(56) References Cited

U.S. PATENT DOCUMENTS

| 7,140,251 B2 * | 11/2006 | Kawauchi et al. | 73/504.16 |
| 7,345,411 B2 * | 3/2008 | Sato et al. | 310/365 |
| 8,134,283 B2 * | 3/2012 | Yamada et al. | 310/346 |
| 8,148,875 B2 * | 4/2012 | Aratake | 310/312 |
| 8,304,965 B2 * | 11/2012 | Aratake et al. | 310/344 |
| 2011/0050044 A1 * | 3/2011 | Funabiki et al. | 310/344 |
| 2011/0127883 A1 * | 6/2011 | Kawaguchi | 310/321 |
| 2011/0140793 A1 * | 6/2011 | Numata et al. | 331/158 |

FOREIGN PATENT DOCUMENTS

| JP | 2002-124845 A | 4/2002 |
| JP | 2003-209198 A | 7/2003 |

OTHER PUBLICATIONS

International Search Report for International Application No. PCT/JP2009/053336, dated May 19, 2009, 1 page.

* cited by examiner

*Primary Examiner* — Bentsu Ro
(74) *Attorney, Agent, or Firm* — Brinks Hofer Gilson & Lione

(57) ABSTRACT

A package and method for manufacturing the package using a rivet having a head portion and a core portion protruding from a rear surface of the head portion. The package includes a plurality of substrates bonded to each other and a cavity that houses an object in a sealed state. The core portion is disposed in a through hole in a base substrate and electrically connects the object with the outside. The core portion is inserted into the through hole and a glass frit is formed between the through hole and the core portion and seals the rivet in the through hole. A gas relief passage is formed leading from a base end of the core portion to a surface of the head portion.

10 Claims, 21 Drawing Sheets

PACKAGE MANUFACTURING METHOD, PACKAGE, PIEZOELECTRIC VIBRATOR, OSCILLATOR, ELECTRONIC DEVICE AND RADIO TIMEPIECE

RELATED APPLICATIONS

This application is a continuation of PCT/JP2009/053336 filed on Feb. 25, 2009. The entire content of this application is incorporated herein by reference.

BACKGROUND OF THE INVENTION

1. Field of the Invention

The present invention relates to a manufacturing method of a package including a cavity for airtightly sealing an object to be housed, a package manufactured by this manufacturing method, and a piezoelectric vibrator, an oscillator, an electronic device and a radio timepiece that use this package.

2. Description of the Related Art

In recent years, mobile telephones and portable information terminal devices employ a piezoelectric vibrator that uses crystal or the like as a time source, a timing source of control signals or the like, and a reference signal source etc. As this type of piezoelectric vibrator, a structure is known that includes a base substrate (a base member), a piezoelectric vibrating reed (a crystal oscillator) mounted on the base substrate, and a lid substrate (a cap member) that is overlaid on the base substrate to airtightly seal the piezoelectric vibrating reed, as described in Patent Document 1 below, for example. Further, this piezoelectric vibrator includes external electrodes (external connection electrodes) on one surface of the base substrate and routing electrodes (crystal connection electrodes) on the other surface of the base substrate, and the piezoelectric vibrating reed is mounted on the routing electrodes. The external electrodes and the routing electrodes are electrically connected by a core portion (a metal member) that penetrates the base substrate.

Here, in Patent Document 1, in order to form the core portion when the above-described piezoelectric vibrator is manufactured, a method is adopted in which a through hole with a small diameter is opened in the base substrate, and a pin-shaped metal member is hammered in while the base substrate is in a heated and softened state. However, with this method, there is a possibility that a gap is formed between the core portion and the through hole. Therefore, it is difficult to ensure airtightness in a cavity formed between the base substrate and the lid substrate.

To address this, a method is conceivable in which, when the core portion is formed, a metal member is disposed in a through hole formed in the base substrate, and at the same time, a glass frit in a paste form is filled between the metal member and the through hole. The filled glass frit is fired to thereby integrally fix together with the through hole, the metal member and the glass frit. According to this method, it is possible to ensure airtightness in the cavity.

In Patent Document 1, when the core portion is formed, the pin-shaped metal member is used as described above. However, a method is also conceivable in which a rivet having a flat plate-shaped head portion and the core portion protruding from a rear surface of the head portion is used in place of the metal member. According to this method, the core portion can be disposed in the through hole by performing a simple operation of just inserting the core portion into the through hole until the rear surface of the head portion comes into contact with the surface of the base substrate. Further, after that, when the glass frit is filled in the through hole, the head portion of the rivet acts as a lid of the through hole, and it is also possible to suppress the glass frit from leaking to the outside.

Note that, when the core portion is formed using the rivet and the glass frit in this manner, generally after firing the glass frit, the head portion of the rivet is polished (ground down) and removed. This makes it possible for the base substrate, the glass frit and the core portion to be flush with each other, and each of the electrodes (the routing electrodes and the external electrodes) can be reliably formed on the base substrate.

Patent Document 1: JP-A-2002-124845

When the glass fit is fired when the core portion is formed, a binder contained in the glass frit is burned and gas is generated inside the glass frit. The gas is released to the outside through a section of the glass frit that is exposed to the outside. However, with the above-described known piezoelectric vibrator manufacturing method, since the head portion of the rivet acts as the lid of the through hole, there is a case in which the gas is not released and an air bubble is formed between the head portion of the rivet and the glass frit.

In this case, when the head portion of the rivet is removed after firing the glass frit, a recessed portion remains in the surface of the glass frit. When the routing electrodes, the external electrodes and the like are formed on the base substrate in a state in which the recessed portion remains in the glass frit, it is difficult to form each of the electrodes to have a uniform thickness, and there is a case in which the electrode is formed with a section whose thickness is considerably thin. In this case, there is a risk that the thin section formed in each of the electrodes is locally disconnected due to deterioration over time or the like, and there is a possibility that conductivity between the piezoelectric vibrating reed and the external electrodes is impaired.

Further, even when the head portion of the rivet is not removed after firing the glass frit, there is a risk that a crack or chip is generated due to the air bubble formed inside the glass frit.

SUMMARY OF THE INVENTION

The invention has been made in light of the foregoing circumstances, and it is an object thereof to provide a manufacturing method of a high quality package in which air bubble formation inside a glass frit is suppressed while airtightness in a cavity is ensured. Further, a package manufactured by this manufacturing method, and a piezoelectric vibrator, an oscillator, an electronic device and a radio timepiece that use this package are provided.

In order to solve the above-described problems and achieve the above-described objects, the invention provides the following means.

(1) A package manufacturing method according to the invention is a method for manufacturing a package using a rivet having a flat plate-shaped head portion and a core portion protruding from a rear surface of the head portion. The package includes: a plurality of substrates in which adjacent substrates are bonded to each other in a laminated state; a cavity which is formed by being sandwiched by a pair of substrates of the plurality of substrates, and which houses an object to be housed in an airtightly sealed state; the core portion which is disposed in a through hole that penetrates a base substrate that is one of the pair of substrates, and which electrically connects the object to be housed with the outside; and a glass frit that is filled between the through hole and the core portion and is fired to form a seal between the through hole and the core portion. The package manufacturing method includes: a rivet disposing step of inserting the core portion into the through hole until the rear surface of the head portion comes into contact with a first surface of the base substrate, and disposing the rivet in the base substrate; a glass frit filling step of filling the glass frit in a paste form between the through hole and the core portion, in the base substrate in which the rivet is disposed; and a firing step of integrally fixing the through hole, the rivet and the glass frit by firing the filled glass frit, and sealing between the through hole and the core portion. A gas relief passage, which leads from a base end of the core portion to one of a side surface and a front surface of the head portion, is formed on the rear surface of the head portion of the rivet.

In the above-described package manufacturing method, since the gas relief passage is formed on the rear surface of the head portion of the rivet, a section, located around the base end of the core portion, of the glass frit in a paste form that is filled in the glass frit filling step is exposed to the outside from the side surface or the front surface of the head portion through the gas relief passage. Accordingly, in the firing step, the gas generated inside the glass frit by a binder contained in the glass frit being fired can be released to the outside through the gas relief passage. As a result, it is possible to suppress air bubble generation between the head portion of the rivet and the glass frit, and it is possible to manufacture a high quality package in which air bubble formation inside the glass frit is suppressed.

(2) Before the glass frit filling step, the method may further include a laminate material adhering step of adhering a laminate material having elasticity and adhesiveness to the first surface so as to cover the head portion of the rivet disposed in the base substrate.

In this case, the laminate material adhering step, in which the laminate material is adhered to the first surface so as to cover the head portion of the rivet disposed in the base substrate, is provided before the glass frit filling step. Therefore, in the glass frit filling step, it is possible to reliably inhibit the glass frit in a paste form from leaking to the outside through the gas relief passage. In addition, the base substrate and the rivet can be held by the laminate material, and it is possible to reliably inhibit the rivet from falling out from the base substrate.

Moreover, since the laminate material has elasticity, in the glass frit filling step, it is possible to reduce a load imposed on a section where the base substrate and the rivet come into contact with each other, and it is possible to suppress generation of cracks in the base substrate.

Thus, when manufacturing the package, while suppressing air bubble formation inside the glass frit, it is also possible to suppress leakage of the glass frit to the outside and crack generation in the base substrate. Therefore, it is possible to improve a manufacturing yield of the package.

(3) The laminate material may include a tape main body having elasticity, and a thermoplastic adhesive coated on the tape main body. The method may further include: before the firing step, a pre-drying step of pre-drying the glass frit by heating the filled glass frit at a temperature lower than that of the firing step; and between the pre-drying step and the firing step, a laminate material peeling off step of peeling off the laminate material from the base substrate.

In this case, since the glass frit is heated and pre-dried in the pre-drying step, adhesion of the thermoplastic adhesive provided in the laminate material is reduced at the same time as the pre-drying. Accordingly, by performing the laminate material peeling off step after the pre-drying step, it is possible to easily and reliably peel off the laminate material from the first surface of the base substrate and the head portion of the rivet, and it is thus possible to improve production efficiency of the package.

Moreover, since the laminate material peeling off step is performed before the firing step, the firing step is performed in a state in which the laminate material has been peeled off Accordingly, when the glass frit is heated to a high temperature enough to be fired in the firing step, there is no case in which the tape main body is fired by the heat, for example, and the quality of the package is thereby affected. Therefore, it is possible to reliably manufacture the high quality package.

(4) After the firing step, the method may include a polishing step of removing the head portion by polishing the first surface side of the base substrate, and exposing the core portion to the first surface of the base substrate.

In this case, since air bubble formation is suppressed between the head portion of the rivet and the glass frit, it is possible to suppress, in the polishing step, a recessed portion from being formed in a section of the glass frit on the first surface side of the base substrate. Therefore, the base substrate, the glass frit and the core portion can be made flush with each other highly accurately. Accordingly, when electrodes are formed on the base substrate, the electrodes can be reliably formed to have a uniform thickness.

(5) Further, a package according to the invention is manufactured by any one of the package manufacturing methods described in (1) to (4) above.

Since the above-described package is manufactured by the package manufacturing method according to the invention, it has excellent airtightness and improved quality.

(6) Further, a package according to the invention includes: a plurality of substrates in which adjacent substrates are bonded to each other in a laminated state; a cavity which is formed by being sandwiched by a pair of substrates of the plurality of substrates, and which houses an object to be housed in an airtightly sealed state; a core portion which is disposed in a through hole that penetrates a base substrate that is one of the pair of substrates, and which electrically connects the object to be housed with the outside; a flat plate portion that is connected to the core portion and is disposed in the cavity; and a glass frit that is filled between the through hole and the core portion and is fired to form a seal between the through hole and the core portion. The flat plate portion is disposed in the cavity so as to cover the through hole, and the glass frit is exposed in the cavity.

According to the above-described package, while the flat plate portion is disposed in the cavity so as to cover the through hole, the glass frit is exposed in the cavity. Accordingly, in manufacturing the package, when the glass frit in a paste form is filled between the core portion and the through hole and thereafter heating is performed in order to fire the filled glass frit, the gas that is generated inside the glass frit by a binder contained in the glass frit being fired can be released to the outside through a section of the glass frit that is exposed in the cavity. As a result, it is possible to suppress air bubble formation between the flat plate portion and the glass frit, and it is thus possible to manufacture the high quality package in which air bubble formation is suppressed inside the glass frit.

(7) A piezoelectric vibrator according to the invention includes: the package described in (5) or (6) above; and a piezoelectric vibrating reed that is housed in the cavity, as the object to be housed.

In the above-described piezoelectric vibrator, the piezoelectric vibrating reed is housed in the cavity that has excellent airtightness. Therefore, the piezoelectric vibrating reed is unlikely to be affected by dust etc., and operates highly accurately. Moreover, the package with improved quality, in which air bubble formation inside the glass frit is suppressed, is used. Thus, the piezoelectric vibrator with improved quality can be obtained.

(8) In an oscillator according to the invention, the piezoelectric vibrator described in (7) above is electrically connected to an integrated circuit, as an oscillation element.

(9) In an electronic device according to the invention, the piezoelectric vibrator described in (7) above is electrically connected to a time measuring portion.

(10) In a radio timepiece according to the invention, the piezoelectric vibrator described in (7) above is electrically connected to a filter portion.

According to the oscillator, the electronic device and the radio timepiece that are described above, since the above-described piezoelectric vibrator is provided, it is possible to similarly improve the quality.

With the package manufacturing method according to the invention, it is possible to manufacture the high quality package in which air bubble formation inside the glass frit is suppressed while airtightness in the cavity is ensured.

Further, the package according to the invention has excellent airtightness and improved quality.

Further, since the piezoelectric vibrator, the oscillator, the electronic device and the radio timepiece according to the invention are provided with the above-described package, it is possible to similarly improve the quality.

DETAILED DESCRIPTION OF THE PREFERRED EMBODIMENTS

First Embodiment

Next, a first embodiment according to the invention will be described with reference to FIG. 1 to FIG. 26. Note that, in the embodiment, a case in which a package is adopted as a piezoelectric vibrator will be described as an example.

As shown in FIG. 1 to FIG. 4, a piezoelectric vibrator 1 of the embodiment is of a surface mount type (a two layer structure type), and includes: a package 5 that is formed such that a base substrate 2 and a lid substrate 3 (a pair of substrates) are laminated and bonded to each other; and a piezoelectric vibrating reed (an object to be housed) 4 that is housed, in an airtightly sealed state, in a cavity C that is formed inside the package 5 by being sandwiched between the base substrate 2 and the lid substrate 3.

(Piezoelectric Vibrating Reed)

Figure 5:
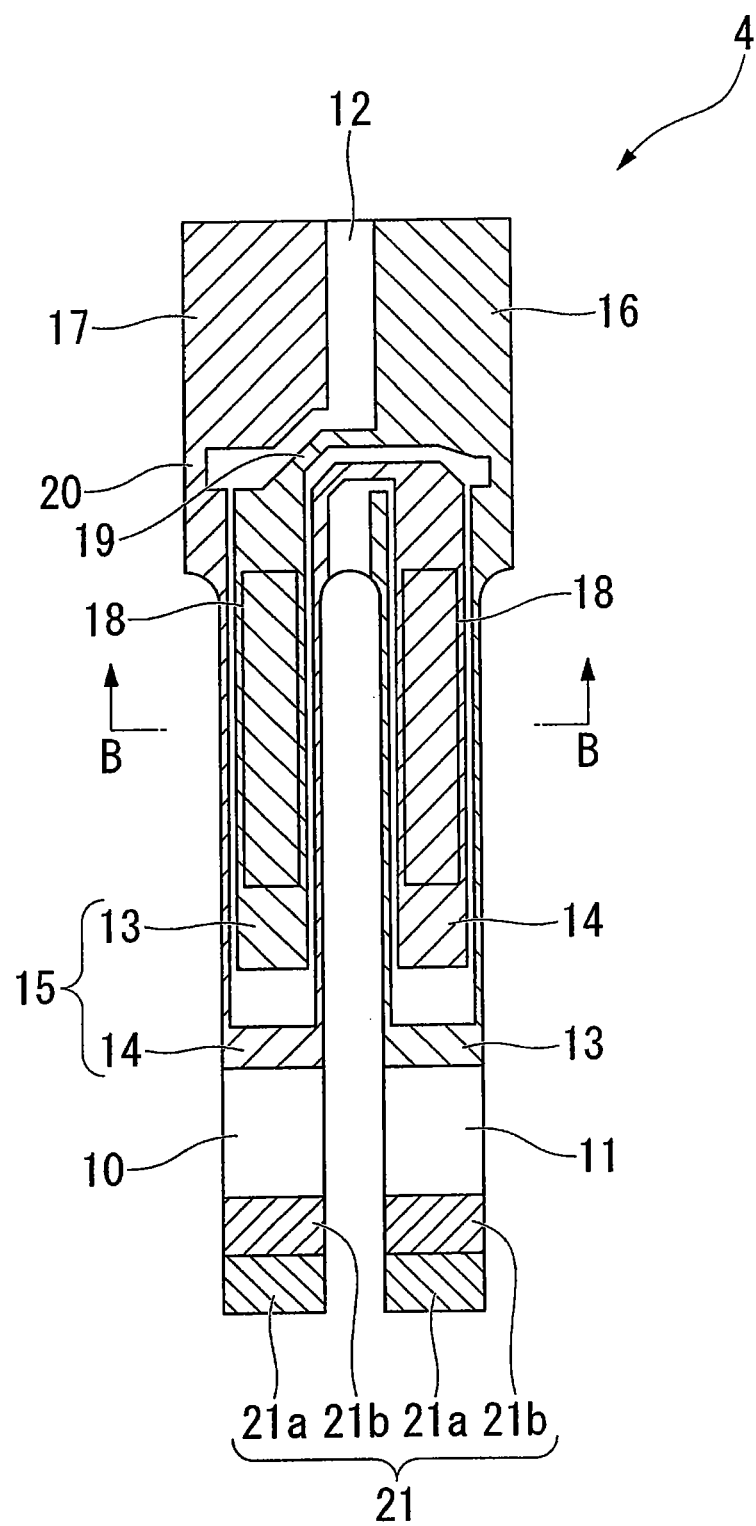
FIG. 5 is a top view of the piezoelectric vibrating reed included in the piezoelectric vibrator shown in FIG. 1.
Figure 6:
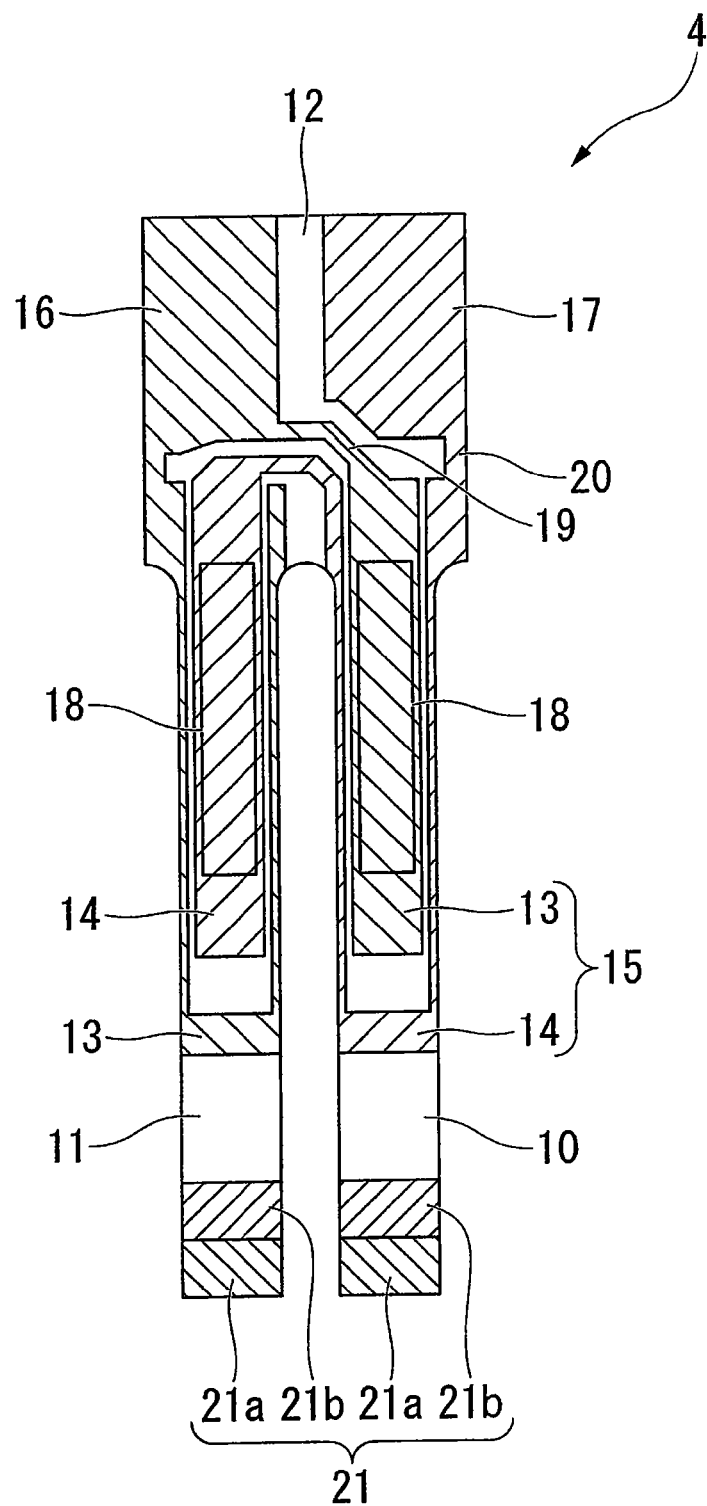
FIG. 6 is a bottom view of the piezoelectric vibrating reed shown in FIG. 5.
Figure 7:
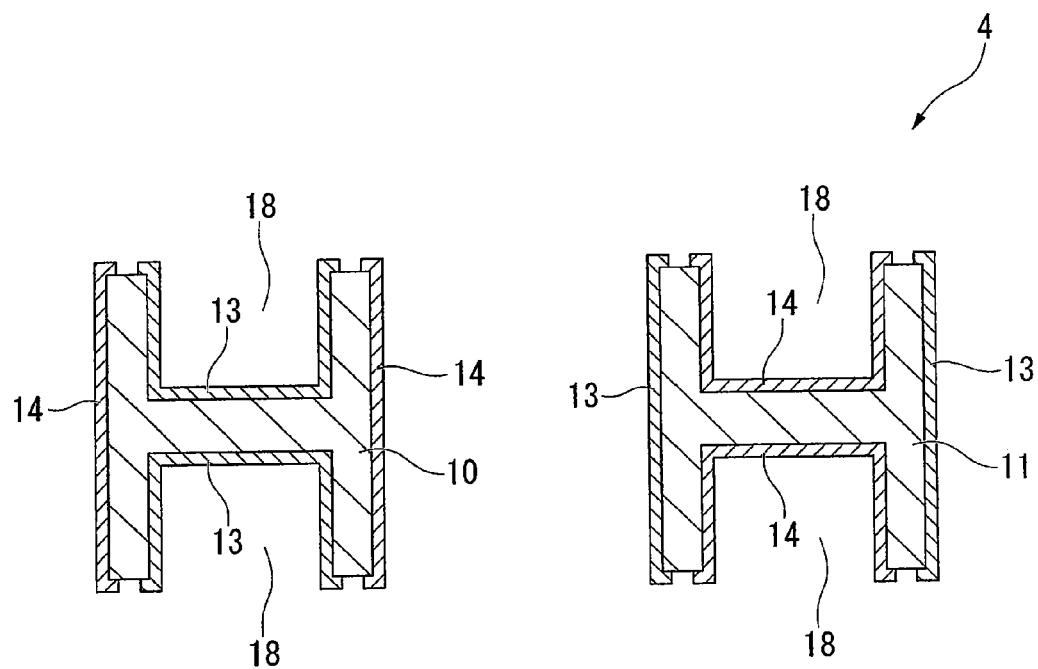
FIG. 7 is a cross-sectional view taken along a line B-B shown in FIG. 5.

As shown in FIG. 5 to FIG. 7, the piezoelectric vibrating reed 4 is a tuning-fork type vibrating reed formed of a piezoelectric material, such as crystal, lithium tantalate, lithium niobate or the like, and it vibrates when a predetermined voltage is applied.

The piezoelectric vibrating reed 4 includes: a pair of vibrating arm portions 10, 11 that are disposed parallel to each other; a base portion 12 that integrally fixes a base end side of the pair of vibrating arm portions 10, 11; excitation electrodes 15 which are each formed by a first excitation electrode 13 and a second excitation electrode 14 and which are formed on outer surfaces of the pair of vibrating arm portions 10, 11 and cause the pair of vibrating arm portions 10, 11 to vibrate; and mount electrodes 16, 17 that are electrically connected to the first excitation electrode 13 and the second excitation electrode 14.

Further, the piezoelectric vibrating reed 4 of the embodiment includes groove portions 18 that are respectively formed on both principal surfaces of the pair of vibrating arm portions 10, 11, along a longitudinal direction of the vibrating arm portions 10, 11. The groove portions 18 are formed from the base end side to substantially the middle of the vibrating arm portions 10, 11.

The excitation electrodes 15, which are each formed by the first excitation electrode 13 and the second excitation electrode 14, are electrodes that cause the pair of vibrating arm portions 10, 11 to vibrate at a predetermined resonance frequency in a direction to move closer to or away from each other. They are patterned and formed on the outer surfaces of the pair of vibrating arm portions 10, 11, respectively, in an electrically isolated state. Specifically, the first excitation electrode 13 is mainly formed on the groove portion 18 of the one vibrating arm portion 10 and on both side surfaces of the other vibrating arm portion 11. The second excitation electrode 14 is mainly formed on both side surfaces of the one vibrating arm portion 10 and on the groove portion 18 of the other vibrating arm portion 11.

Further, the first excitation electrode 13 and the second excitation electrode 14 are electrically connected to the mount electrodes 16, 17 via routing electrodes 19, 20, respectively, on both principal surfaces of the base portion 12. A voltage is applied to the piezoelectric vibrating reed 4 via the mount electrodes 16, 17.

Note that the excitation electrodes 15, the mount electrodes 16, 17 and the routing electrodes 19, 20 that are described above are formed by coating a conductive film of chromium (Cr), nickel (Ni), aluminum (Al) or titanium (Ti), for example.

Furthermore, tip ends of the pair of vibrating arm portions 10, 11 are coated with a weight metal film 21 for performing adjustment (frequency adjustment) of their own vibration states so as to vibrate within a predetermined frequency range. The weight metal film 21 is divided into a rough tuning film 21a that is used to roughly adjust the frequency and a fine tuning film 21b that is used to finely adjust the frequency. By adjusting the frequency with the use of the rough tuning film 21a and the fine tuning film 21b, the frequency of the pair of vibrating arm portions 10, 11 can be set to fall within the nominal frequency range of a device.

Figure 3:
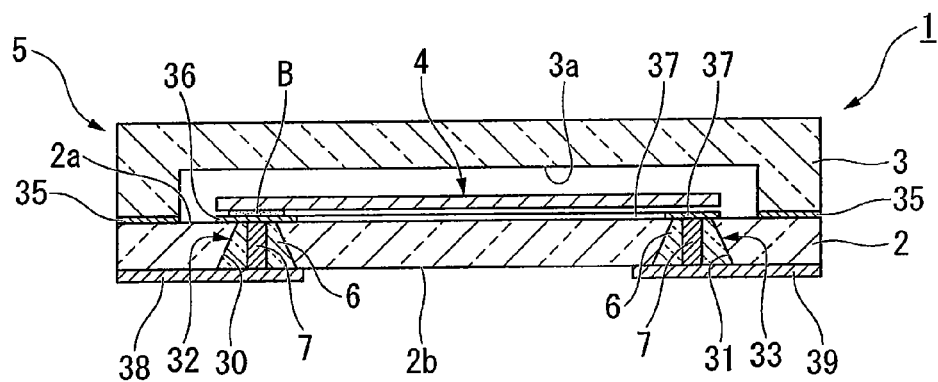
FIG. 3 is an arrow cross-sectional view taken along a line A-A shown in FIG. 2.
Figure 4:
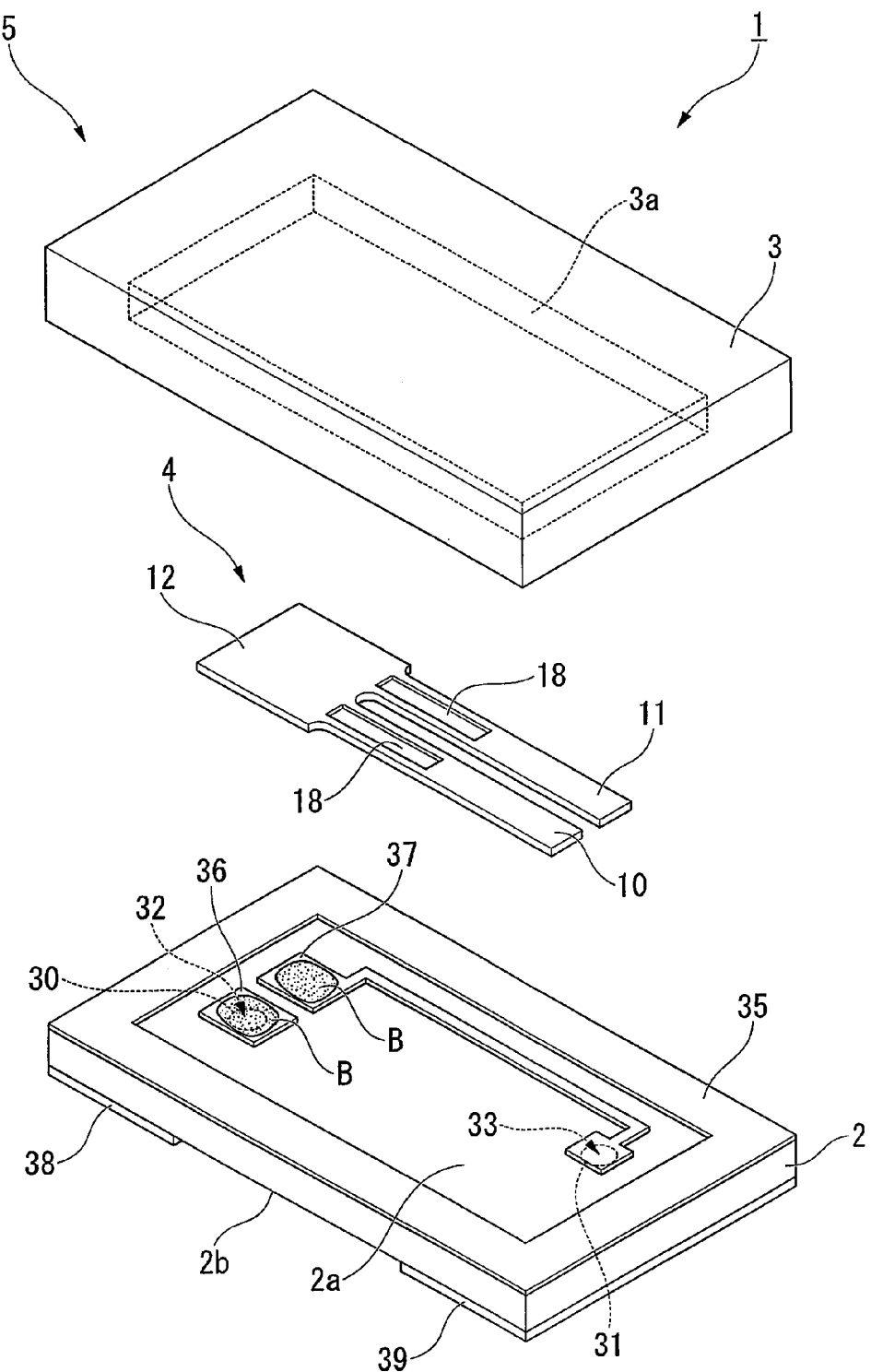
FIG. 4 is an exploded perspective view of the piezoelectric vibrator shown in FIG. 1.

The piezoelectric vibrating reed 4 structured in this way is bump-bonded to an upper surface (a first surface) 2a of the base substrate 2 using bumps B made of gold or the like as shown in FIG. 3 and FIG. 4. More specifically, the pair of mount electrodes 16, 17 are respectively bump bonded in a contact state, on the two bumps B formed on routing electrodes 36, 37, to be described later, that are patterned on the upper surface 2a of the base substrate 2. Thus, the piezoelectric vibrating reed 4 is supported in a floating state from the upper surface 2a of the base substrate 2 while the mount electrodes 16, 17 and the routing electrodes 36, 37 are electrically connected to each other, respectively.

(Package)

Next, the structure of the package 5 will be described.

Figure 1:
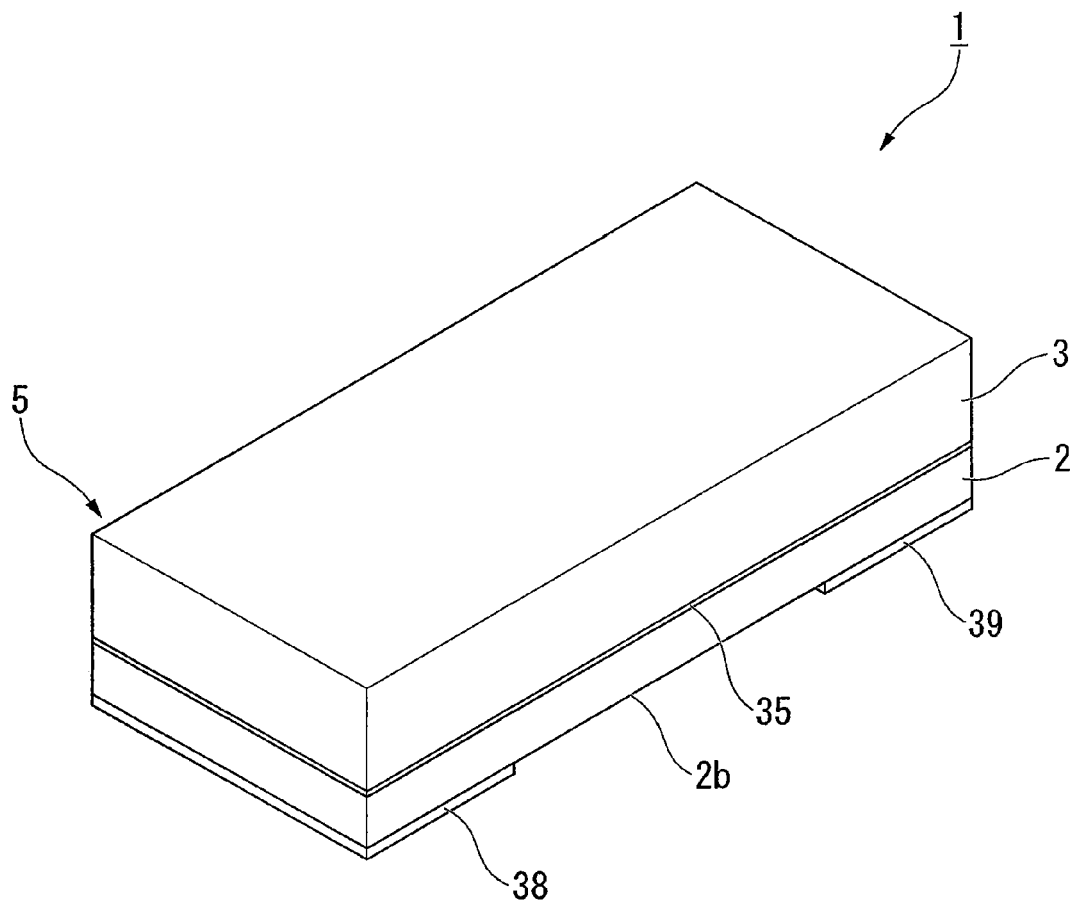
FIG. 1 is an external perspective view showing a piezoelectric vibrator according to a first embodiment of the invention.
Figure 2:
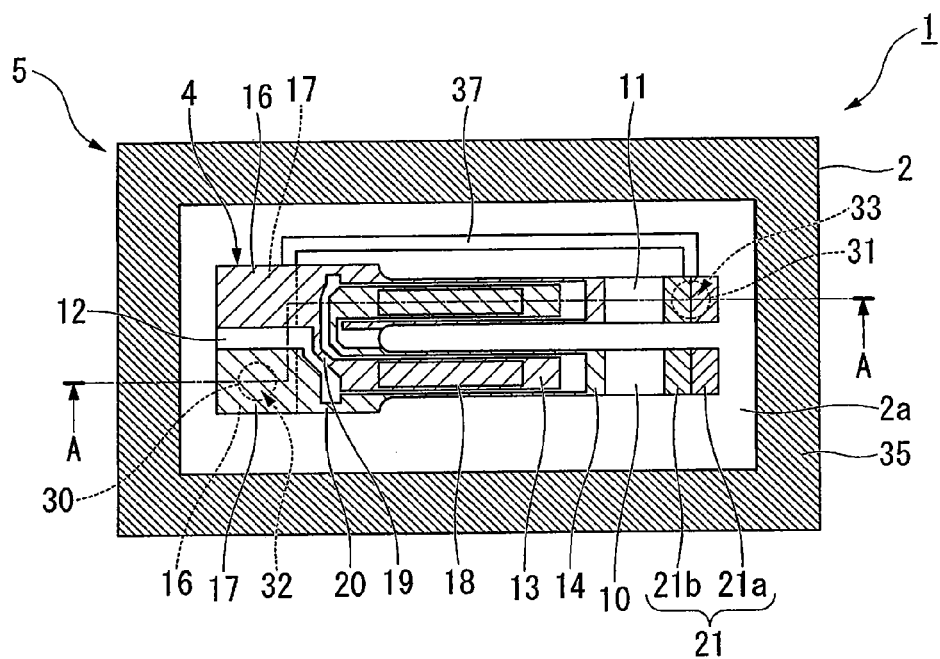
FIG. 2 is an internal structural view of the piezoelectric vibrator shown in FIG. 1, and is a view showing a piezoelectric vibrating reed when viewed from above in a state in which a lid substrate is removed.

The above-described lid substrate 3 is a transparent insulating substrate made of a glass material, such as soda lime glass for example, and is formed in a board-like form as shown in FIG. 1, FIG. 3 and FIG. 4. A rectangular-shaped recessed portion 3a, in which the piezoelectric vibrating reed 4 is housed, is formed on a bonding surface side to which the base substrate 2 is bonded.

The recessed portion 3a is a recessed portion for a cavity that becomes the cavity C, which is formed between the both substrates 2, 3 when the both substrates 2, 3 are overlapped and aligned, and which houses the piezoelectric vibrating reed 4. The lid substrate 3 is anodically bonded to the base substrate 2 in a state in which the recessed portion 3a faces the base substrate 2 side.

Similarly to the lid substrate 3, the above-described base substrate 2 is a transparent insulating substrate made of a glass material, such as soda lime glass for example, and is formed in a board-like form having a size that can be overlapped and aligned with the lid substrate 3, as shown in FIG. 1 to FIG. 4.

A pair of through holes 30, 31 that penetrate the base substrate 2 are formed in the base substrate 2. At this time, the pair of through holes 30, 31 are formed to be located in the cavity C. More specifically, the through holes 30, 31 of the embodiment are formed such that one of them, the through hole 30, is formed at a position corresponding to the base portion 12 side of the mounted piezoelectric vibrating reed 4, and the other of them, the through hole 31, is formed at a position corresponding to the tip end side of the vibrating arm portions 10, 11. Note that, in the embodiment, through holes having a tapered cross section, whose diameter is gradually reduced from a lower surface 2b toward the upper surface 2a of the base substrate 2, will be used as an example for explanation. However, without being limited to this example, through holes that straightly penetrate the base substrate 2 may be used. In either case, it is sufficient if the base substrate 2 is penetrated.

A pair of through electrodes 32, 33 are formed in the pair of through holes 30, 31 so as to fill the through holes 30, 31. As shown in FIG. 3, these through electrodes 32, 33 are each formed by a glass frit 6 and a core portion 7 that are integrally fixed to the through holes 30, 31 by firing. They completely fill the through holes 30, 31 to maintain airtightness in the cavity C, and also serve to conduct a current between external electrodes 38, 39, which will be described later, and the routing electrodes 36, 37.

Figure 8:
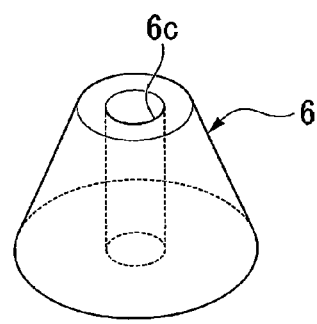
FIG. 8 is a perspective view of a glass frit that forms a through electrode in the piezoelectric vibrator shown in FIG. 3.
Figure 18:
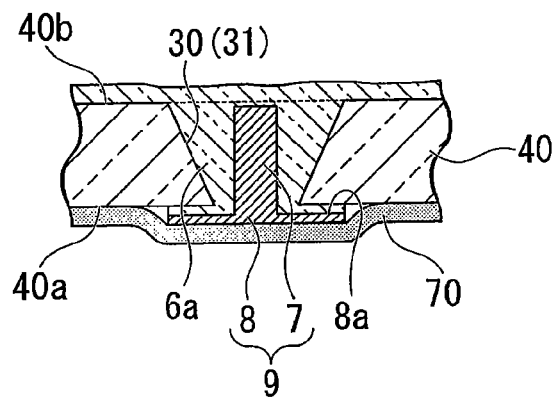
FIG. 18 is a view showing a process when the piezoelectric vibrator is manufactured according to the flowchart shown in FIG. 12, and is a view showing a state in which the glass frit is filled in the through holes after the state shown in FIG. 17.

As shown in FIG. 8, the above-described glass fit 6 is obtained by firing a glass frit 6a in a paste form (refer to FIG. 18). The glass frit 6 has flat both ends, and is formed in a cylindrical shape having substantially the same thickness as that of the base substrate 2. The core portion 7 is arranged at the center of the glass frit 6 so as to penetrate the glass frit 6. Further, in the embodiment, the glass frit 6 is formed to have a conical outer shape (a tapered shape in cross section) in accordance with the shape of the through holes 30, 31. As shown in FIG. 3, the glass frit 6 is fired in a state in which it is embedded in the through holes 30, 31, and is very firmly fixed to the through holes 30, 31.

The core portion 7 is a conductive core that is formed in a column shape using a metal material. Similarly to the glass frit 6, it is formed to have flat both ends and substantially the same thickness as that of the base substrate 2. The core portion 7 is located in a center hole 6*c* of the glass frit 6, and is very firmly fixed to the glass frit 6 by firing the glass frit 6. In summary, the core portion 7 is disposed in each of the through holes 30, 31 and electrically connects the piezoelectric vibrating reed 4 to the outside.

In the through electrodes 32, 33 formed as described above, the glass frit 6, which is filled and fired between each of the through holes 30, 31 and the core portion 7, forms a seal between each of the through holes 30, 31 and the core portion 7 to thereby maintain airtightness in the cavity C.

As shown in FIG. 1 to FIG. 4, a bonding film 35 for anodic bonding and the pair of routing electrodes 36, 37 are patterned on the upper surface 2*a* side (a bonding surface side to which the lid substrate 3 is bonded) of the base substrate 2, using a conductive material such as aluminum, for example. Among them, the bonding film 35 is formed along the periphery of the base substrate 2 in such a manner as to surround the circumference of the recessed portion 3*a* formed in the lid substrate 3.

The pair of routing electrodes 36, 37 are patterned in such a manner as to electrically connect the one through electrode 32 of the pair of through electrodes 32, 33 with the one mount electrode 16 of the piezoelectric vibrating reed 4 and to electrically connect the other through electrode 33 and the other mount electrode 17 of the piezoelectric vibrating reed 4.

More specifically, the one routing electrode 36 is formed directly above the one through electrode 32 so as to be positioned directly below the base portion 12 of the piezoelectric vibrating reed 4. The other routing electrode 37 is formed to be positioned directly above the other through electrode 33 after being drawn from a position adjacent to the one routing electrode 36 to the tip end side of the vibrating arm portions 10, 11 along the vibrating arm portions 10, 11.

The bumps B are respectively formed on the pair of routing electrodes 36, 37, and the bumps B are used to mount the piezoelectric vibrating reed 4. Thus, the one mount electrode 16 of the piezoelectric vibrating reed 4 conducts to the one through electrode 32 via the one routing electrode 36, and the other mount electrode 17 conducts to the other through electrode 33 via the other routing electrode 37.

As shown in FIG. 1, FIG. 3 and FIG. 4, the external electrodes 38, 39 that are electrically connected to the pair of through electrodes 32, 33, respectively, are formed on the lower surface 2*b* of the base substrate 2. In other words, the one external electrode 38 is electrically connected to the first excitation electrode 13 of the piezoelectric vibrating reed 4 via the one through electrode 32 and the one routing electrode 36. The other external electrode 39 is electrically connected to the second excitation electrode 14 of the piezoelectric vibrating reed 4 via the other through electrode 33 and the other routing electrode 37.

When the piezoelectric vibrator 1 structured in this way is operated, a predetermined driving voltage is applied to the external electrodes 38, 39 formed on the base substrate 2. Thus, it is possible to conduct a current to the excitation electrodes 15 that are each formed by the first excitation electrode 13 and the second excitation electrode 14 of the piezoelectric vibrating reed 4. Thus, it is possible to cause the pair of vibrating arm portions 10, 11 to vibrate at a predetermined frequency in a direction to move closer to or away from each other. Then, by using the vibration of the pair of vibrating arm portions 10, 11, use is possible as a time source, a timing source of control signals and a reference signal source etc.

(Rivet)

Figure 9:
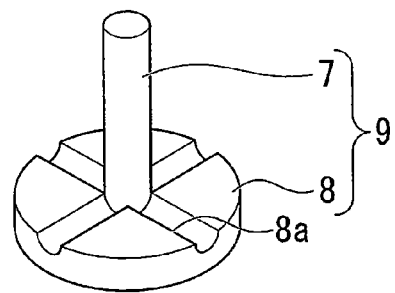
FIG. 9 is a perspective view of a rivet that is used in manufacturing the piezoelectric vibrator shown in FIG. 1.

Next, a rivet 9 that is used in manufacturing the above-described piezoelectric vibrator 1 will be described. As shown in FIG. 9, the rivet 9 is provided with a flat plate-shaped head portion 8 and the core portion 7 that protrudes from a rear surface of the head portion 8. In the embodiment, the core portion 7 protrudes in a column shape from the head portion 8 in a direction substantially orthogonal to the rear surface of the head portion 8, and has a flat tip end. The head portion 8 is formed in a round shape in a plan view, and the core portion 7 protrudes from a central portion in the plan view of the head portion 8.

Note that a length (a protruding amount) of the core portion 7 is set to a length that is, for example, 0.02 mm shorter than the thickness of the base substrate wafer 40 before the polishing process, which will be described later.

Gas relief passages 8*a* that lead from a base end of the core portion 7 to a side surface of the head portion 8 are formed on the rear surface of the head portion 8 of the rivet 9. As shown in FIG. 9, in the embodiment, the gas relief passages 8*a* are formed by a plurality of concave grooves that are linear in the plan view, being arranged in a radial pattern in the plan view on the rear surface of the head portion 8, centering on the base end of the core portion 7. Further, in the example shown in the drawing, the four gas relief passages 8*a* are formed at equal intervals around a central axis of the rivet 9. Note that the depth of the gas relief passages 8*a* is about half of the thickness of the head portion 8, for example.

Figure 10:
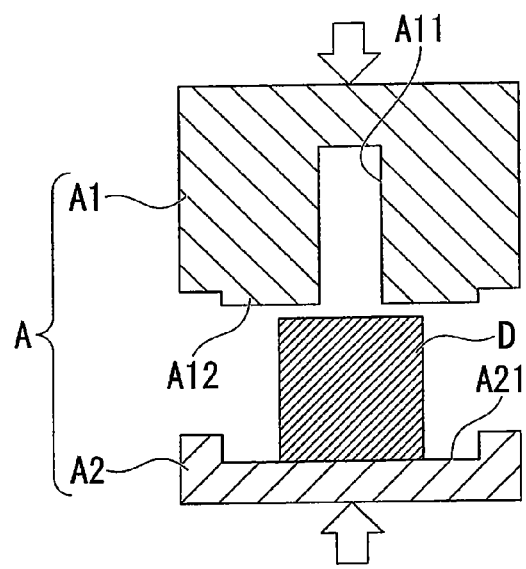
FIG. 10 is a view showing a manufacturing process of the rivet shown in FIG. 9, and is a view showing a state in which a base material is placed between forging dies.
Figure 11:
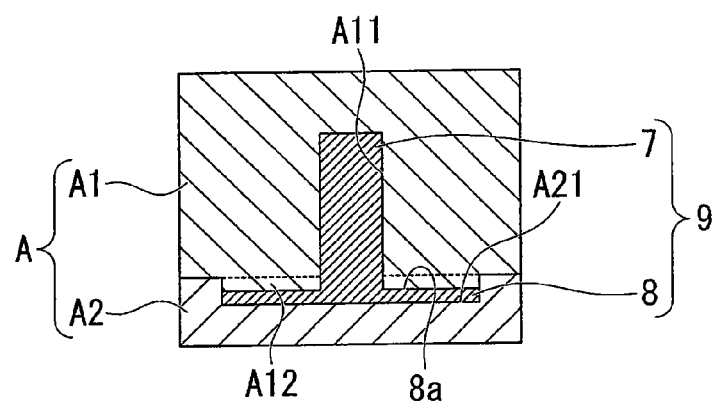
FIG. 11 is a view showing a state in which the rivet is forged using the forging dies after the state shown in FIG. 10.

The above-described rivet 9 is manufactured by die-forging a base material D of the rivet 9 as shown in FIG. 10 and FIG. 11. In the embodiment, the base material D of the rivet 9 is forged using a forging die A that includes an upper die A1 in which a recessed portion A11 having the outer shape of the core portion 7 is formed, and a lower die A2 in which a recessed portion A21 having the outer shape of the head portion 8 is formed. Note that the base material D is formed, for example, of an Fe—Ni alloy, Kovar or the like.

In the embodiment, the gas relief passages 8*a* are formed at the same time as the die forging of the rivet 9. In the example shown in the drawings, a passage protruding portion A12 corresponding to the gas relief passages 8*a* is formed in a section adjacent to an edge of the recessed portion A11 of the upper die A1, and the gas relief passages 8*a* are formed by the passage protruding portion A12 during the die forging.

As a result, it is possible to manufacture the rivet 9 efficiently as compared to, for example, a case in which the gas relief passages 8*a* are processed after the outer shape of the rivet 9 is die-forged.

(Piezoelectric Vibrator Manufacturing Method)

Next, a manufacturing method for manufacturing a plurality of the above-described piezoelectric vibrators 1 at one time using the rivet 9, the base substrate wafer 40 and a lid substrate wafer 50 will be described with reference to the flowchart shown in FIG. 12.

First, the piezoelectric vibrating reed 4 shown in FIG. 5 to FIG. 7 is formed by performing a piezoelectric vibrating reed forming process (S10). Specifically, first, a rough quartz crystal lambert is sliced at a predetermined angle to obtain a wafer having a constant thickness. Subsequently, the wafer is lapped and subjected to crude processing, and after that, a work-affected layer is removed by etching. Then, the wafer is subjected to mirror polishing processing, such as polishing, to obtain the wafer having a predetermined thickness. Subsequently, the wafer is subjected to appropriate processing such as cleaning, and after that, the wafer is patterned to have the outer shape of the piezoelectric vibrating reed 4 by a photolithography technique. At the same time, a metal film is formed and patterned, thus forming the excitation electrodes 15, the routing electrodes 19, 20, the mount electrodes 16, 17, and the weight metal film 21. In this way, it is possible to manufacture a plurality of the piezoelectric vibrating reeds 4.

Moreover, after the piezoelectric vibrating reeds 4 are formed, rough tuning of a resonance frequency is performed. This is performed by irradiating the rough tuning film 21a of the weight metal film 21 with a laser beam to cause it to partially evaporate, thus changing the weight. Note that fine tuning to adjust the resonance frequency more accurately is performed after a mounting process. This fine tuning will be described later.

Figure 13:
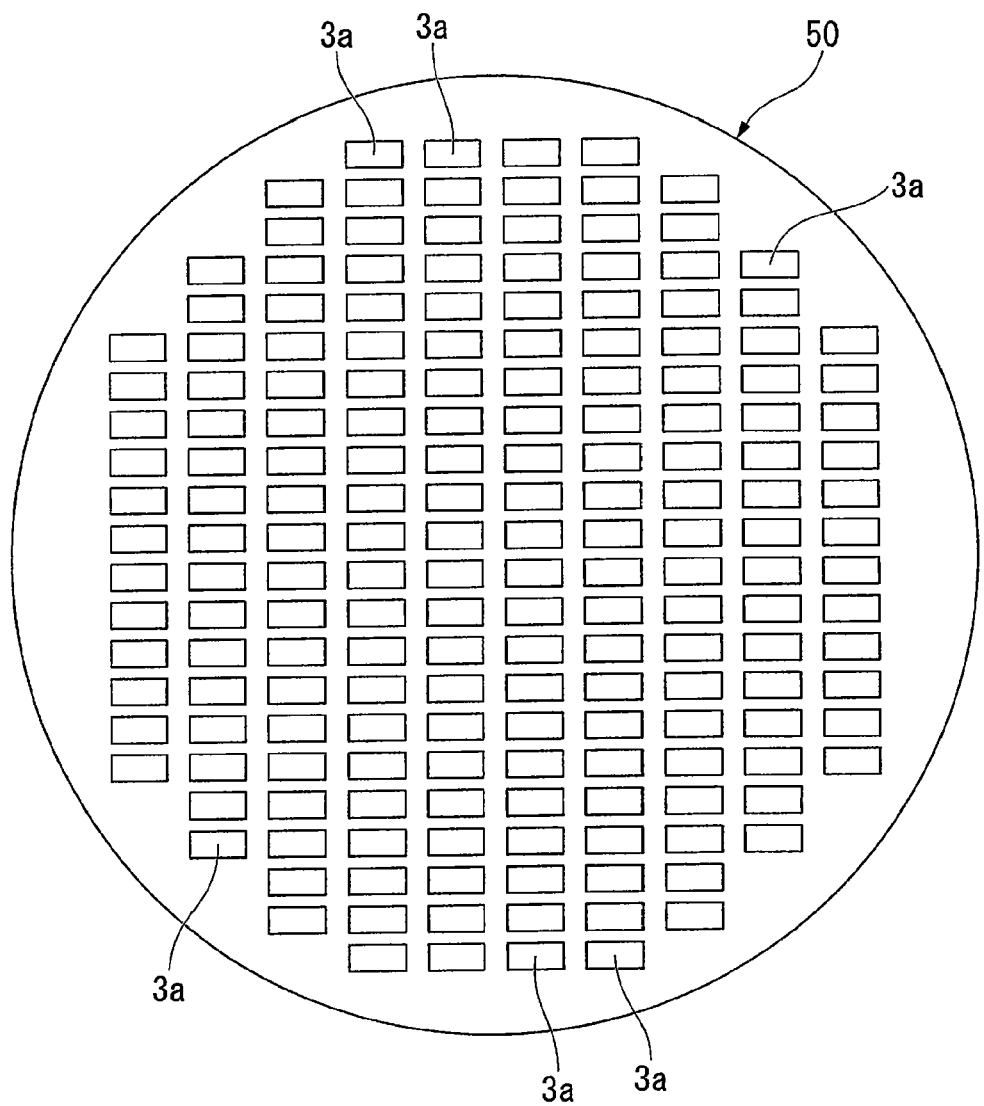
FIG. 13 is a view showing a process when the piezoelectric vibrator is manufactured according to the flowchart shown in FIG. 12, and is a view showing a state in which a plurality of recessed portions are formed in a lid substrate wafer that becomes the lid substrate.

Next, a first wafer forming process is performed in which the lid substrate wafer 50, which later becomes the lid substrate 3, is formed up to a state immediately before performing anodic bonding (S20). First, after the soda lime glass is polished and processed to a predetermined thickness and then cleaned, the disc-shaped lid substrate wafer 50, from which a work-affected layer on an outermost surface has been removed by etching or the like, is formed as shown in FIG. 13 (S21). Then, a recessed portion forming process is performed, in which a plurality of the recessed portions 3a for cavities are formed in a row direction in a bonding surface of the lid substrate wafer 50 by a method such as press working, etching or the like (S22). At this point in time, the first wafer forming process ends.

Next, concurrently with the above-described process, or at a timing before or after it, a second wafer forming process is performed in which the base substrate wafer 40, which later becomes the base substrate 2, is formed up to a state immediately before performing anodic bonding (S30). First, after the soda lime glass is polished and processed to a predetermined thickness and then cleaned, the disc-shaped base substrate wafer 40, from which a work-affected layer on an outermost surface has been removed by etching or the like, is formed (S31). At this time, the base substrate wafer 40 is formed to be 0.02 mm thicker than the length of the core portion 7 of the rivet 9, for example. Next, a through electrode forming process is performed in which a plurality of pairs of the through electrodes 32, 33 are formed in the base substrate wafer 40 (S30A). Here, the through electrode forming process 30A will be described in detail.

Figure 14:
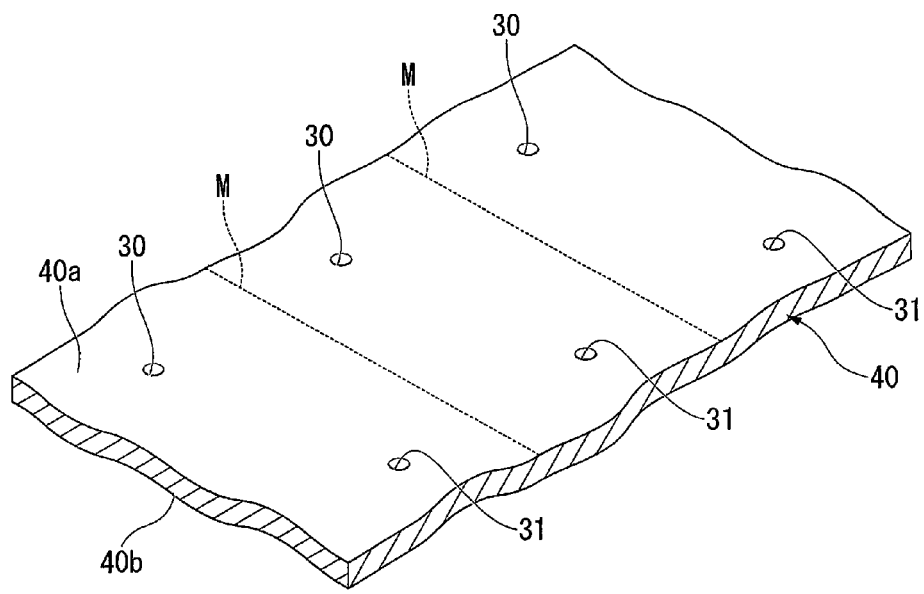
FIG. 14 is a view showing a process when the piezoelectric vibrator is manufactured according to the flowchart shown in FIG. 12, and is a view showing a state in which a plurality of through holes are formed in a base substrate wafer that becomes a base substrate.
Figure 15:
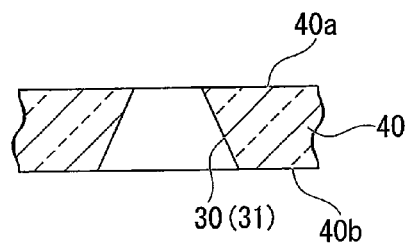
FIG. 15 is a view showing the state shown in FIG. 14 as viewed from a cross section of the base substrate wafer.

First, as shown in FIG. 14, a through hole forming process (S32) is performed in which a plurality of pairs of the through holes 30, 31 that penetrate the base substrate wafer 40 are formed. Note that dotted lines M shown in FIG. 14 indicate cutting lines along which cutting is performed in a cutting process, which will be performed later. This process is performed from a lower surface 40b side of the base substrate wafer 40 using a sandblasting method, for example. By doing this, as shown in FIG. 15, it is possible to form the through holes 30, 31 which have a tapered cross section and whose diameter is gradually reduced from the lower surface 40b toward an upper surface (a first surface) 40a of the base substrate wafer 40. Further, the plurality of pairs of through holes 30, 31 are formed such that, when the two wafers 40, 50 are later overlapped and aligned, the pairs of through holes 30, 31 are located in the recessed portions 3a formed in the lid substrate wafer 50. In addition, they are formed such that the one through hole 30 is positioned on the base portion 12 side of the piezoelectric vibrating reed 4 while the other through hole 31 is positioned on the tip end side of the vibrating arm portions 10, 11.

Figure 16:
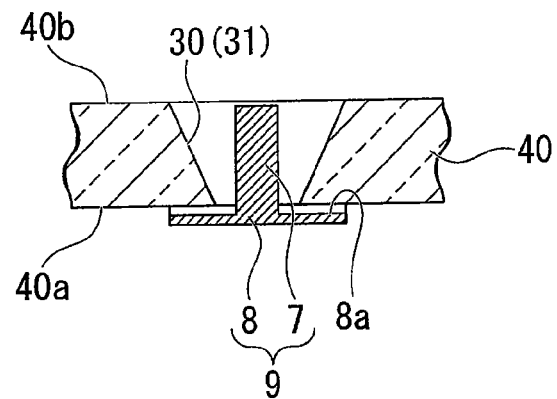
FIG. 16 is a view showing a process when the piezoelectric vibrator is manufactured according to the flowchart shown in FIG. 12, and is a view showing a state in which the rivet is disposed in the base substrate wafer after the state shown in FIG. 15.

Subsequently, a rivet disposing process (S33) is performed in which the core portions 7 of the rivets 9 are inserted into the plurality of through holes 30, 31 and the rivets 9 are disposed in the base substrate wafer 40. At this time, as shown in FIG. 16, the core portions 7 are inserted until the rear surfaces of the head portions 8 of the rivets 9 come into contact with the upper surface 40a of the base substrate wafer 40. In the embodiment, since the core portions 7 protrude from the rear surfaces of the head portions 8 in a substantially orthogonal direction, the core portions 7 can be disposed in the through holes 30, 31 by a simple operation of just pressing the head portions 8 until they come into contact with the upper surface 40a of the base substrate wafer 40. At the same time, it is possible to substantially match an axial direction of the core portions 7 with an axial direction of the through holes 30, 31. Note that, by forming the head portions 8 in a flat plate shape, the base substrate wafer 40 is stable without occurrence of looseness even if the base substrate wafer 40 is placed on a plane surface, such as a desk, for example, until a later firing process.

Figure 17:
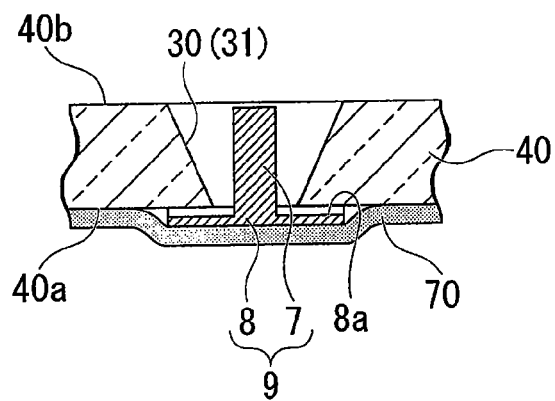
FIG. 17 is a view showing a process when the piezoelectric vibrator is manufactured according to the flowchart shown in FIG. 12, and is a view showing a state in which a laminate material is adhered after the state shown in FIG. 16.

Next, as shown in FIG. 17, a laminate material adhering process (S34) is performed in which a laminate material 70 is adhered to the upper surface 40a of the base substrate wafer 40 such that it covers the head portions 8 of the rivets 9. In the embodiment, the laminate material 70 is adhered over substantially the entire upper surface 40a of the base substrate wafer 40. In the example shown in the drawing, the laminate material 70 is a paper tape body coated with an acrylic thermoplastic adhesive, for example, and preferably has a thickness of 50 µm to 200 µm. With the use of the laminate material 70, it is possible to ensure that there is no gap between the upper surface 40a of the base substrate wafer 40 and the rear surfaces of the head portions 8 of the rivets 9. More specifically, since the rear surfaces of the head portions 8 are brought into contact with the upper surface 40a of the base substrate wafer 40, the glass frit 6a in a paste form can be reliably filled into the through holes 30, 31 in a glass frit filling process (S35), which will be described later.

Next, as shown in FIG. 18, the glass frit filling process (S35) is performed in which the glass frit 6a in a paste form is filled between the through holes 30, 31 and the core portions 7 in a state in which the laminate material 70 is adhered to the upper surface 40a of the base substrate wafer 40. In the embodiment, the glass frit 6a in a paste form is filled by applying it from the lower surface 40b side of the base substrate wafer 40 of the through holes 30, 31. At this time, since the gas relief passages 8a are formed on the rear surface of each of the rivets 9, a section of the glass frit 6a in a paste form that is located around the base end of the core portion 7 is exposed from the side surface of the head portion 8 to the outside through the gas relief passages 8a. On the other hand, since the laminate material 70 is adhered to the upper surface 40a of the base substrate wafer 40, it is possible to reliably inhibit the glass frit 6a in a paste form from leaking to the outside. In addition, the base substrate wafer 40 and the rivets 9 can be held by the laminate material 70, and it is possible to reliably inhibit the rivets 9 from falling out from the base substrate wafer 40.

Further, in the embodiment, a more than sufficient amount of the glass frit 6a is applied in the glass frit filling process so that the glass frit 6a is reliably filled in the through holes 30, 31. Accordingly, the glass frit 6a is also applied to the lower surface 40b of the base substrate wafer 40. If the glass frit 6a is fired in this state, a longer time is required for the polishing process, which will be described later. Therefore, a glass frit removing process is performed (S36) in which the excess glass frit 6a is removed before firing.

Figure 19:
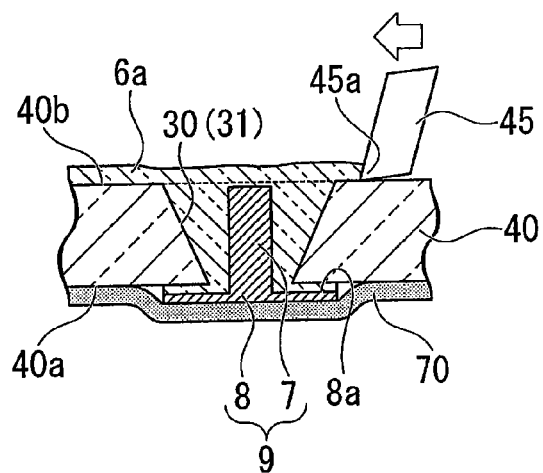
FIG. 19 is a view showing a process when the piezoelectric vibrator is manufactured according to the flowchart shown in FIG. 12, and is a view showing a process step in which the excess glass frit is removed after the state shown in FIG. 18.
Figure 20:
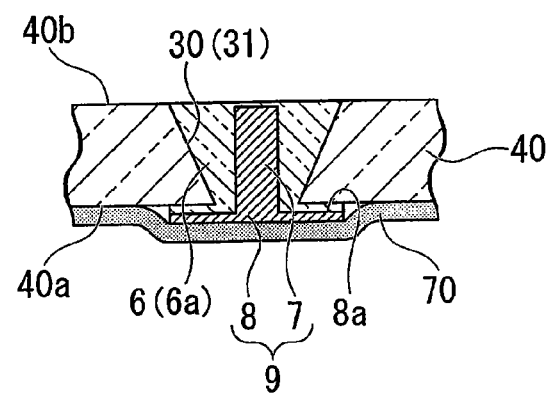
FIG. 20 is a view showing a process when the piezoelectric vibrator is manufactured according to the flowchart shown in FIG. 12, and is a view showing a state in which the glass frit in a paste form is pre-dried after the state shown in FIG. 19.

As shown in FIG. 19, in the glass frit removing process, a squeegee 45 made of resin, for example, is used. An edge 45a of the squeegee 45 is brought into contact with the lower surface 40b of the base substrate wafer 40 and is moved so that the glass frit 6a emerging from the through holes 30, 31 is removed. By doing this, the excess glass frit 6a can be reliably removed with a simple operation, as shown in FIG. 20. Then, in the embodiment, since the length of the core portion 7 of the rivet 9 is 0.02 mm shorter than the thickness of the base substrate wafer 40, it is possible to inhibit the edge 45a of the squeegee 45 from coming into contact with the tip end of the core portion 7 when the squeegee 45 passes through an upper portion of each of the through holes 30, 31. Thus, it is possible to inhibit inclination of the core portion 7.

Subsequently, a pre-drying process is performed in which the filled glass frit 6a in a paste form is heated and pre-dried (S37). At this time, the glass frit 6a is heated at a temperature lower than that of the firing process, which will be described later. In the embodiment, the glass frit 6a is pre-dried by heating it for 30 minutes at 80 degrees, for example. This reduces the fluidity of the glass frit 6a that was in a paste form, and the pre-dried glass frit 6 is maintained, with its shape unchanged, in the through holes 30, 31. At this time, since heating is performed in a state in which the laminate material 70 is adhered, the adhesion of the thermoplastic adhesive of the laminate material 70 is reduced.

Figure 21:
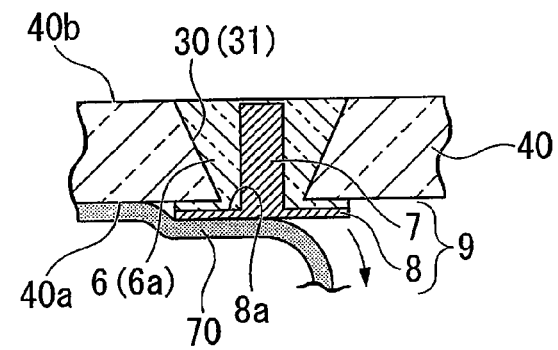
FIG. 21 is a view showing a process when the piezoelectric vibrator is manufactured according to the flowchart shown in FIG. 12, and is a view showing a process step in which the laminate material is peeled off after the state shown in FIG. 20.

Subsequently, as shown in FIG. 21, a laminate material peeling off process (S38) is performed in which the laminate material 70 is peeled off from the upper surface 40a of the base substrate wafer 40. At this time, it is possible to easily and reliably peel off the laminate material 70 because the adhesion of the thermoplastic adhesive of the laminate material 70 is reduced in the pre-drying process (S37), and it is thus possible to improve production efficiency of the piezoelectric vibrator 1.

Subsequently, the firing process (S39) is performed in which the glass frit 6 filled into the through holes 30, 31 is fired at a predetermined temperature. By doing this, the through holes 30, 31, the glass frit 6 filled into the through holes 30, 31 and the rivet 9 disposed in the glass frit 6 are bonded to each other and integrally fixed, thus forming the seal between the core portion 7 and each of the through holes 30, 31. Further, at this time, since the head portion 8 is also fired, they can be integrally fixed while maintaining a state in which the axial direction of the core portion 7 is substantially matched with the axial direction of the through holes 30, 31.

Next, the heating temperature and the heating time in the firing process will be described in detail. First, the glass frit 6 is heated at 350 degrees for 30 to 60 minutes, for example, so that a binder contained in the glass frit 6 is fired and pre-firing (binder removal) is performed. Then, the glass frit 6 is heated at 530 degrees for 10 minutes, for example, so that the glass frit 6 is subjected to main firing. By doing this, the pre-dried glass frit 6 is fired and solidified.

Figure 22:
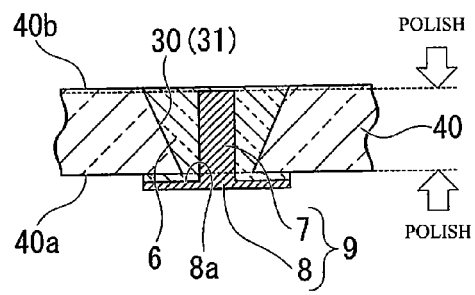
FIG. 22 is a view showing a process when the piezoelectric vibrator is manufactured according to the flowchart shown in FIG. 12, and is a view showing a process step in which a head portion of the rivet and a surface of the base substrate wafer are polished after the state shown in FIG. 21.

Subsequently, as shown in FIG. 22, a polishing process is performed in which the upper surface 40a side of the base substrate wafer 40 is polished and the head portion 8 of each of the rivets 9 is removed (S40). By doing this, the head portion 8, which has served to locate the glass frit 6 and the core portion 7, is removed, and the core portion 7 alone is left inside the glass frit 6, thus making it possible for the core portion 7 to be exposed to the upper surface 40a of the base substrate wafer 40.

Further, at this time, the lower surface 40b side of the base substrate wafer 40 is polished so that the tip end of the core portion 7 is exposed and the lower surface 40b of the base substrate wafer 40 is made flat at the same time. As a result, it is possible to obtain a plurality of pairs of the through electrodes 32, 33 in which the glass frit 6 and the core portion 7 are integrally fixed.

With the above processes, the surfaces (the upper surface 40a and the lower surface 40b) of the base substrate wafer 40 and the both ends of the glass frit 6 and the core portion 7 are made substantially flush with each other. In other words, the surfaces of the base substrate wafer 40 and the surfaces of the through electrodes 32, 33 can be made substantially flush with each other. Note that, when the polishing process is completed, the through electrode forming process (S30A) ends.

Figure 23:
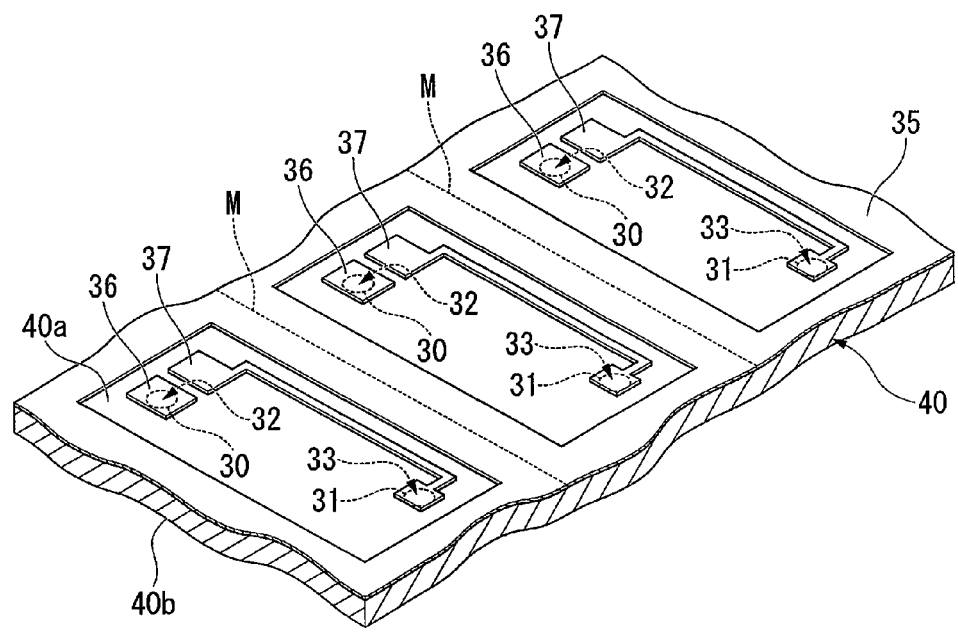
FIG. 23 is a view showing a process when the piezoelectric vibrator is manufactured according to the flowchart shown in FIG. 12, and is a view showing a state in which a bonding film and routing electrodes are patterned on an upper surface of the base substrate wafer after the state shown in FIG. 22.
Figure 24:
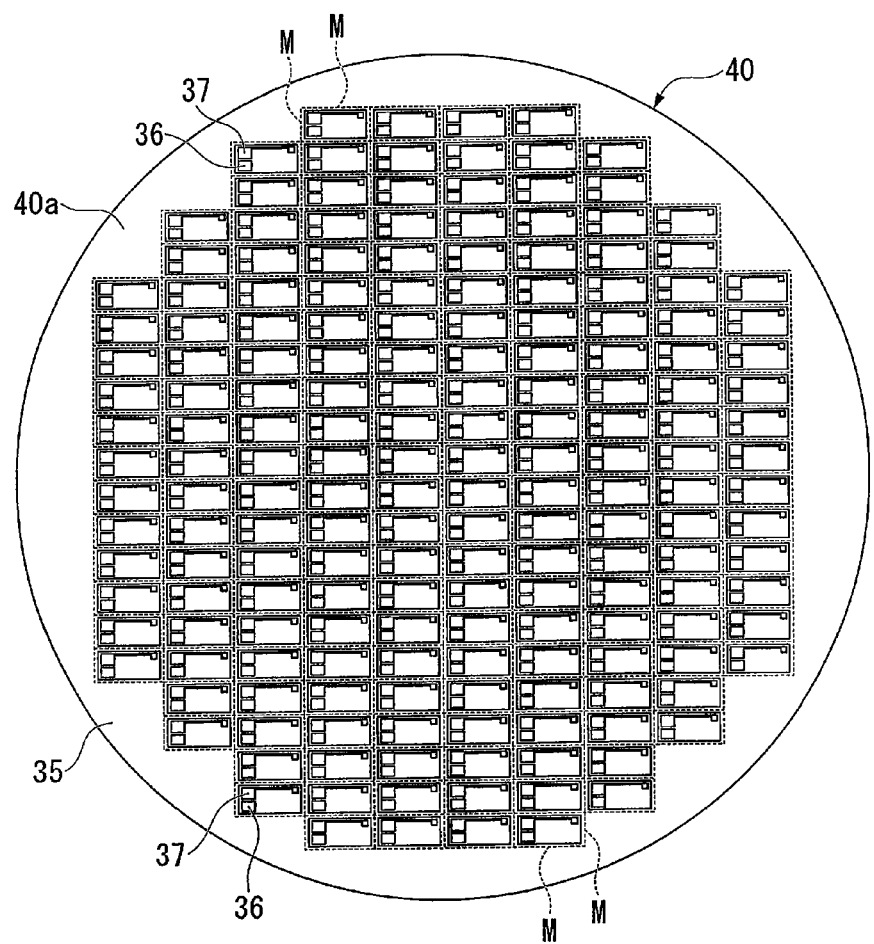
FIG. 24 is an overall view of the base substrate wafer in the state shown in FIG. 23.

Next, a bonding film forming process is performed in which a conductive material is patterned on the upper surface 40a of the base substrate wafer 40, and the bonding film 35 is formed as shown in FIG. 23 and FIG. 24 (S41). At the same time, a routing electrode forming process is performed in which a plurality of the routing electrodes 36, 37 that are respectively and electrically connected to each of the pairs of through electrodes 32, 33 are formed (S42). Note that dotted lines M shown in FIG. 23 and FIG. 24 indicate cutting lines along which cutting is performed in the cutting process, which will be performed later.

In particular, the through electrodes 32, 33 are substantially flush with the upper surface 40a of the base substrate wafer 40 as described above. Therefore, the routing electrodes 36, 37 patterned on the upper surface of the base substrate wafer 40 come into contact with the through electrodes 32, 33 in a firmly fixed state without generating a gap between them. Thus, it is possible to ensure conductivity between the one routing electrode 36 and the one through electrode 32, and conductivity between the other routing electrode 37 and the other through electrode 33. At this point in time, the second wafer forming process ends.

Figure 12:
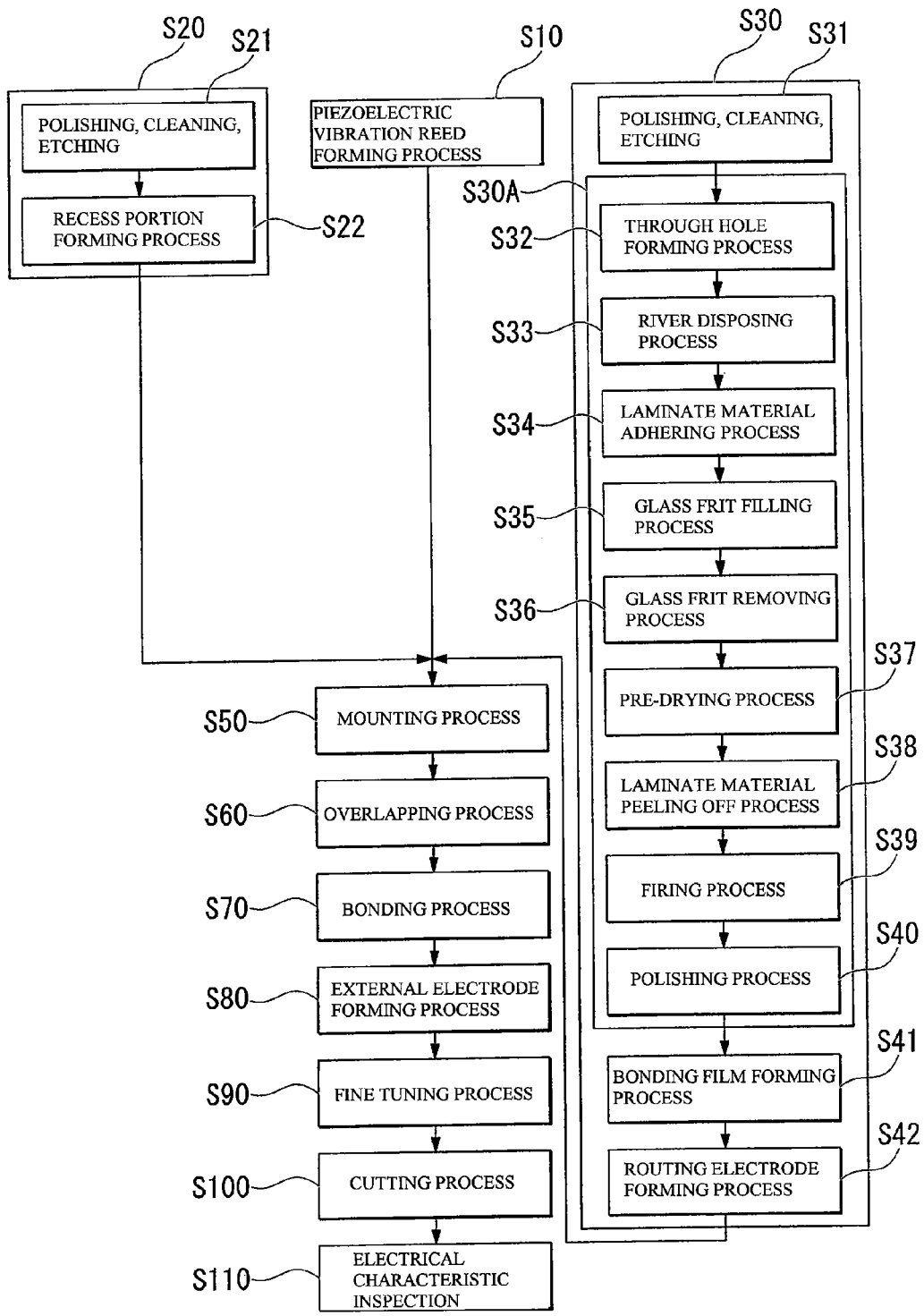
FIG. 12 is a flowchart showing a manufacturing flow of the piezoelectric vibrator shown in FIG. 1.

It should be noted that the process sequence in FIG. 12 indicates that the routing electrode forming process (S42) is performed after the bonding film forming process (S41). However, contrary to this, the bonding film forming process (S41) may be performed after the routing electrode forming process (S42), or the two processes may be performed simultaneously. Irrespective of the process sequence, the same operational effect can be obtained. Therefore, the process sequence may be changed appropriately according to necessity.

Next, a mounting process is performed in which the plurality of formed piezoelectric vibrating reeds 4 are bonded to the upper surface 40a of the base substrate wafer 40 via the routing electrodes 36, 37, respectively (S50). At this time, first, the bump B made of gold or the like is formed on each of the pair of routing electrodes 36, 37. Then, after the base portion 12 of the piezoelectric vibrating reed 4 is placed on the bump B, the piezoelectric vibrating reed 4 is pressed against the bump B while the bump B is heated to a predetermined temperature. By doing this, the piezoelectric vibrating reed 4 is mechanically supported by the bump B while the mount electrodes 16, 17 and the routing electrodes 36, 37 are brought into an electrically connected state. Therefore, at this point in time, the pair of excitation electrodes 15 of the piezoelectric vibrating reed 4 are conducted to the through electrodes 32, 33, respectively.

In particular, since the piezoelectric vibrating reed 4 is bump bonded, it is supported in a floating state from the upper surface 40a of the base substrate wafer 40.

After mounting of the piezoelectric vibrating reed 4 is completed, an overlapping process is performed in which the lid substrate wafer 50 is overlapped and aligned with the base substrate wafer 40 (S60). Specifically, the two wafers 40 and 50 are aligned to a correct position using a reference mark or the like, not shown in the drawings, as an index. By doing this, the mounted piezoelectric vibrating reed 4 is housed in the cavity C that is surrounded by the recessed portion 3a formed in the base substrate wafer 40 and by the two wafers 40, 50.

Figure 25:
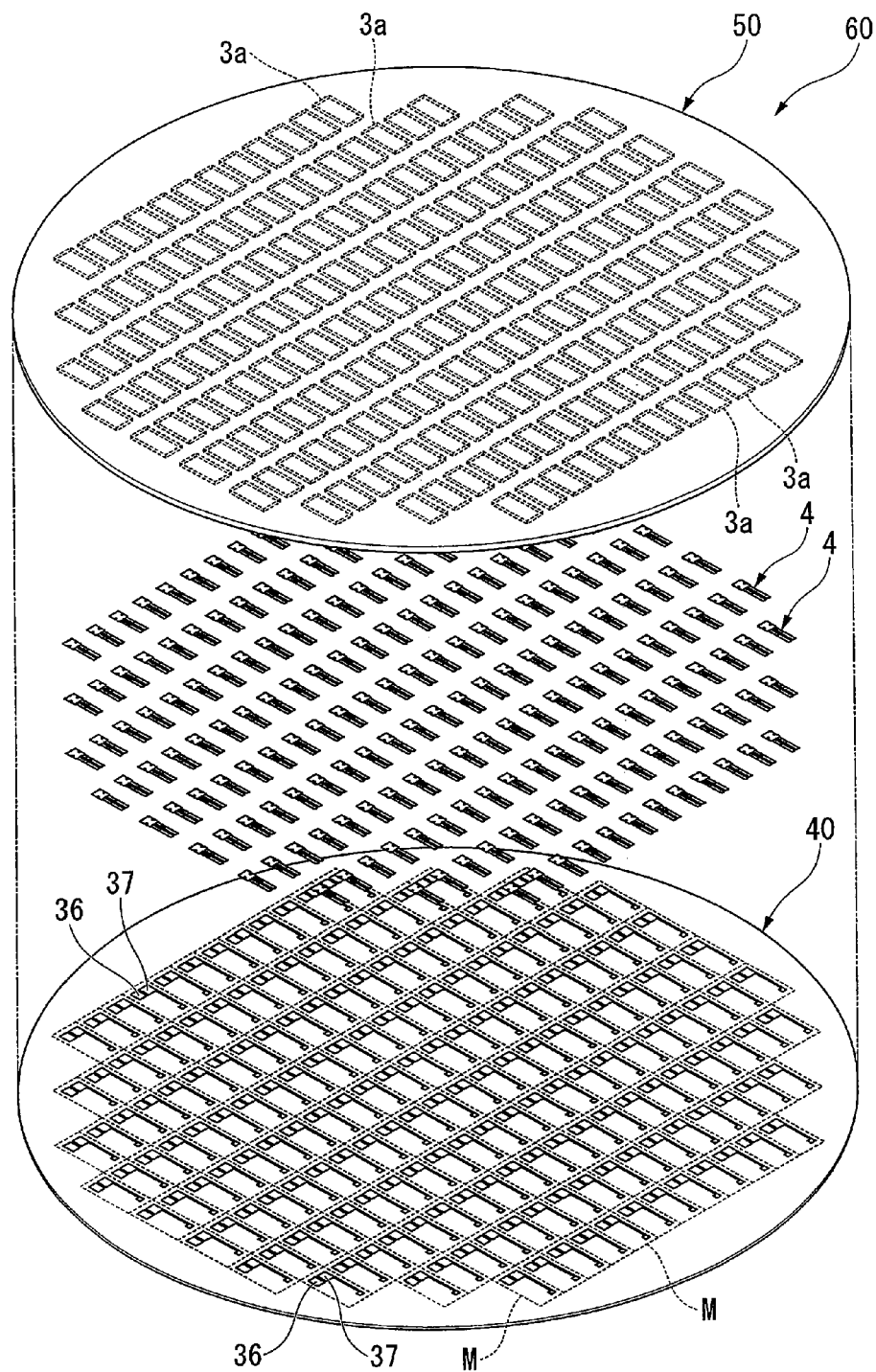
FIG. 25 is a view showing a process when the piezoelectric vibrator is manufactured according to the flowchart shown in FIG. 12, and is an exploded perspective view of a wafer body in which the base substrate wafer and the lid substrate wafer are anodically bonded together in a state in which the piezoelectric vibrating reed is housed in the cavity.

After the overlapping process, a bonding process is performed in which the two overlapped wafers 40 and 50 are anodically bonded together by placing them in an anodic bonding apparatus, not shown in the drawings, and applying a predetermined voltage in a predetermined temperature atmosphere (S70). Specifically, the predetermined voltage is applied between the bonding film 35 and the lid substrate wafer 50. In response to this, an electrochemical reaction occurs at an interface between the bonding film 35 and the lid substrate wafer 50, and they are firmly bonded to each other and anodic bonding is achieved. Thus, the piezoelectric vibrating reed 4 can be sealed in the cavity C, and a wafer body 60 shown in FIG. 25 can be obtained in which the base substrate wafer 40 and the lid substrate wafer 50 are bonded to each other. Note that FIG. 25 illustrates an exploded state of the wafer body 60 in order to facilitate visual understanding of the drawing, and the illustration of the bonding film 35 is omitted from the base substrate wafer 40. Note that dotted lines M shown in FIG. 25 indicate cutting lines along which cutting is performed in the cutting process, which will be performed later.

It should be noted that, when the anodic bonding is performed, since the through holes 30, 31 formed in the base substrate wafer 40 are completely blocked by the through electrodes 32, 33, the airtightness inside the cavity C is not impaired by the through holes 30, 31. In particular, since the glass frit 6 and the core portion 7 are integrally fixed by firing and they are very firmly fixed to the through holes 30 and 31, the airtightness inside the cavity C can be reliably maintained.

After the above-described anodic bonding is completed, an external electrode forming process is performed in which a conductive material is patterned on the lower surface 40b of the base substrate wafer 40 and a plurality of the pairs of external electrodes 38, 39, which are respectively and electrically connected to the pairs of through electrodes 32, 33, are formed (S80). With this process, the piezoelectric vibrating reed 4 that is sealed in the cavity C can be operated utilizing the external electrodes 38, 39.

In particular, also when performing this process, the through electrodes 32, 33 are substantially flush with the lower surface 40b of the base substrate wafer 40, similarly to a case in which the routing electrodes 36, 37 are formed. Therefore, the patterned external electrodes 38, 39 come into contact with the through electrodes 32, 33 in a firmly fixed state without generating a gap etc. between them. Thus, it is possible to ensure conductivity of the external electrodes 38, 39 with the through electrodes 32, 33.

Next, a fine tuning process is performed in which the frequency of each of the individual piezoelectric vibrators 1 sealed in the cavities C in the state of the wafer body 60 is fine-tuned to make it fall within a predetermined range (S90). Specifically, a voltage is applied to the pair of external electrodes 38, 39 formed on the lower surface 40b of the base substrate wafer 40 to thereby vibrate the piezoelectric vibrating reed 4. Then, while measuring the frequency, laser light is irradiated from the outside through the lid substrate wafer 50, to thereby evaporate the fine tuning film 21b of the weight metal film 21. As a result, the weight of the tip end side of the pair of vibrating arm portions 10, 11 changes, and therefore the frequency of the piezoelectric vibrating reed 4 can be fine-tuned so as to fall within a predetermined range of a nominal frequency.

After the fine tuning of the frequency is completed, the cutting process is performed in which the bonded wafer body 60 is cut into small pieces along the cutting lines M shown in FIG. 25 (S100). As a result, a plurality of the two layer structure-type surface mount piezoelectric vibrators 1 shown in FIG. 1 can be manufactured all at once, in which the piezoelectric vibrating reed 4 is sealed in the cavity C formed between the base substrate 2 and the lid substrate 3 that are anodically bonded to each other.

Note that the process sequence may be changed such that the fine tuning process (S90) is performed after the cutting process (S100) has been performed and small pieces of the individual piezoelectric vibrators 1 have been obtained. However, as described above, by first performing the fine tuning process (S90), the fine tuning can be performed in the state of the wafer body 60, and the plurality of piezoelectric vibrators 1 can thus be fine-tuned more efficiently. Accordingly, it is preferable because throughput can be improved.

After that, an inspection of internal electrical characteristics is performed (S110). More specifically, a resonance frequency, a resonance resistance value, and drive level characteristics (an excitation power dependence of the resonance frequency and the resonance resistance value) etc. of the piezoelectric vibrating reed 4 are measured and checked. In addition, insulation resistance characteristics etc. are also checked. Finally, an external appearance inspection of the piezoelectric vibrator 1 is performed to finally check the dimensions and the quality etc. This completes the manufacture of the piezoelectric vibrator 1.

Figure 26:
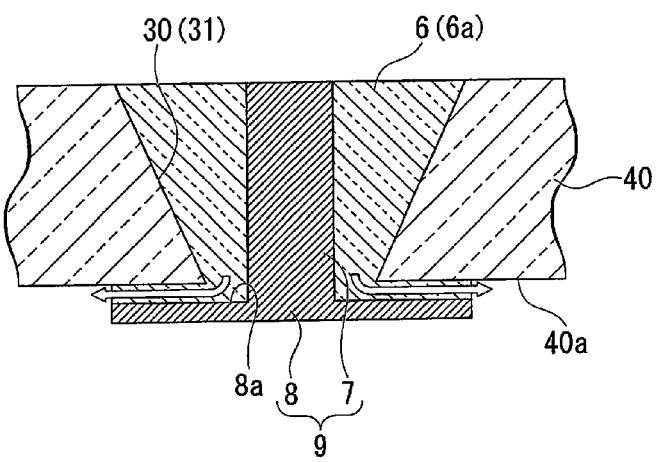
FIG. 26 is a view showing a process when the piezoelectric vibrator is manufactured according to the flowchart shown in FIG. 12, and is a view showing a manner in which gas that is generated inside the glass frit in a firing process is released to the outside.

According to the above-described package 5 and the manufacturing method of the piezoelectric vibrator 1 including the package 5, as shown in FIG. 26, a section, located around the base end of the core portion 7, of the glass frit 6a in a paste form that is filled in the glass frit filling process is exposed from the side surface of the head portion 8 to the outside through the gas relief passages 8a. Accordingly, in the firing process, the gas that is generated inside the glass frit by the binder contained in the glass frit 6 being fired can be released to the outside through the gas relief passages 8a. As a result, it is possible to suppress air bubble formation between the head portion 8 of the rivet 9 and the glass fit 6, and it is thus possible to manufacture the high quality package 5 in which air bubble formation is suppressed inside the glass frit 6.

Further, since the laminate material 70 has elasticity, it is possible to reduce a load imposed on a section where the base substrate wafer 40 and the rivet 9 come into contact with each other, in the glass frit filling process. It is therefore possible to suppress crack generation in the base substrate wafer 40.

In this way, when manufacturing the package 5, while air bubble formation is suppressed inside the glass frit 6, it is possible to suppress leakage of the glass frit 6 to the outside and crack generation in the base substrate wafer 40. It is therefore possible to improve a manufacturing yield of the package 5.

Further, since the laminate material peeling off process is performed before the firing process, the firing process is performed in a state in which the laminate material 70 has been peeled off. Accordingly, when the glass frit 6 is heated to a high temperature sufficient to be fired in the firing process, there is no case in which a tape main body is fired by the heat, for example, and the quality of the package 5 is thereby affected. Therefore, it is possible to reliably manufacture the high quality package 5.

Further, by setting the thickness of the laminate material 70 from 50 µm to 200 µm, an appropriate cushion property is obtained for the laminate material 70, and it is therefore possible to inhibit crack generation in the base substrate wafer 40 when the glass frit 6a is filled into the through holes 30, 31. Note that, if the laminate material 70 is too thin, the appropriate cushion property is not obtained, and therefore there is a possibility of crack generation in the base substrate wafer 40. In contrast, if the laminate material 70 is too thick, the cushion property is excessively high, and a load is imposed on a section where the base substrate wafer 40 and the rivet 9 come into contact with each other, leading to a possibility of crack generation in the base substrate wafer 40.

Further, since air bubble formation is suppressed between the head portion 8 of the rivet 9 and the glass frit 6, it is possible to suppress a recessed portion from being formed on a section of the glass frit 6 on the upper surface 40a side of the base substrate wafer 40, in the polishing process. Therefore, the base substrate wafer 40, the glass frit 6 and the core portion 7 can be made flush with each other highly accurately. Accordingly, when the routing electrodes 36, 37 are formed on the base substrate wafer 40, they can be reliably formed to have a uniform thickness. This makes it possible to inhibit local disconnection of the routing electrodes 36, 37 due to deterioration over time or the like, and it is therefore possible to improve reliability of the package 5 and the piezoelectric vibrator 1.

Further, since the package 5 according to the embodiment is manufactured by the above-described manufacturing method, it is excellent in airtightness and improved quality is obtained.

Further, in the piezoelectric vibrator 1 according to the embodiment, since the piezoelectric vibrating reed 4 is housed in the cavity that has excellent airtightness, the piezoelectric vibrating reed 4 is unlikely to be affected by dust etc., and operates highly accurately. Further, air bubble formation inside the glass frit 6 is suppressed, and the package 5 with improved quality is used. Therefore, the piezoelectric vibrator 1 with improved quality can be obtained.

Second Embodiment

Next, a second embodiment according to the invention will be described based on FIG. 27 to FIG. 29.

Note that, in the second embodiment, structural members that are the same as those of the first embodiment are denoted with the same reference numerals and a description thereof is omitted, and only different points will be described.

Figure 27:
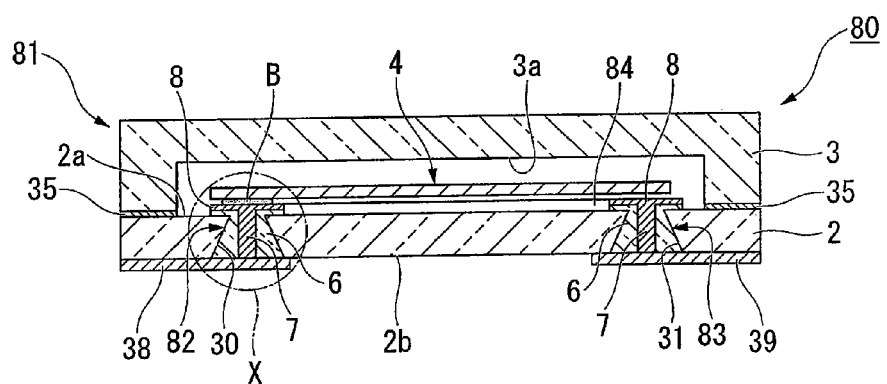
FIG. 27 is a cross-sectional view of a piezoelectric vibrator according to a second embodiment of the invention.
Figure 28:
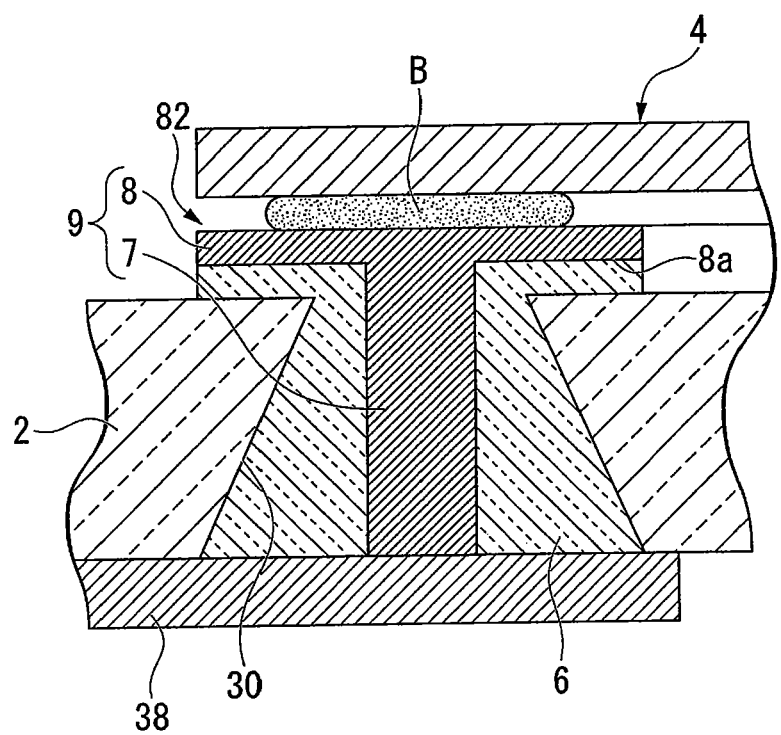
FIG. 28 is an enlarged view of an X portion shown in FIG. 27.
Figure 29:
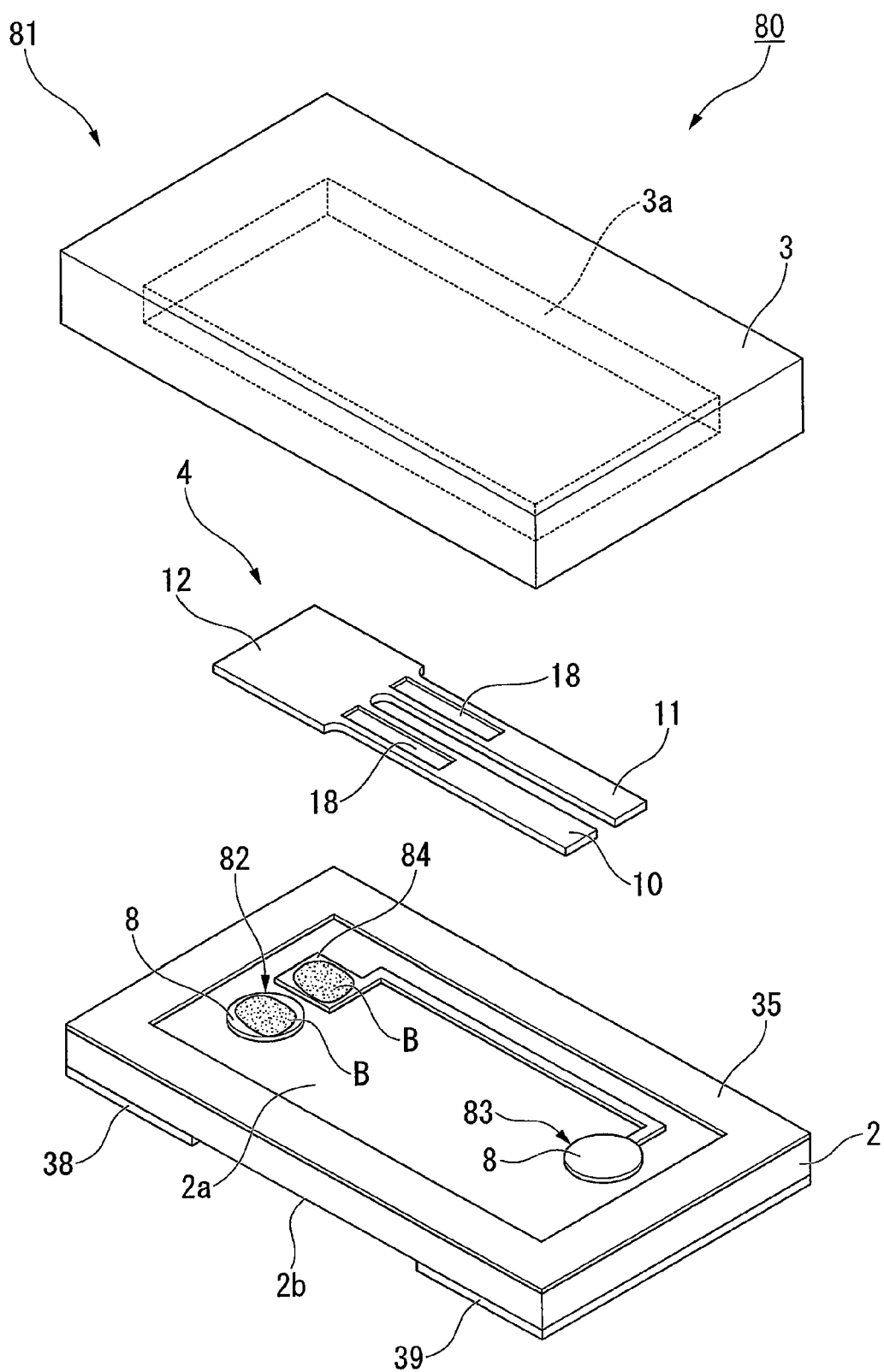
FIG. 29 is an exploded perspective view of the piezoelectric vibrator shown in FIG. 27.

As shown in FIG. 27 to FIG. 29, in a piezoelectric vibrator 80 according to the embodiment, the head portion (the flat plate portion) 8 that is connected to the core portion 7 and is disposed in the cavity C is provided in a package 81. As shown in FIG. 28, the head portion 8 is disposed in the cavity C so as to cover each of the through holes 30, 31. In other words, in the embodiment, the head portion 8 of the rivet 9 is not polished and is left in the cavity C.

Further, while the head portion 8 is disposed to cover each of the through holes 30, 31, the glass frit 6 is exposed in the cavity C. In the example shown in the drawing, the glass frit 6 is filled into the gas relief passages 8a of the head portion 8, and a section of the glass frit 6 that is filled into the edges of the gas relief passages 8a is exposed in the cavity C.

Further, as shown in FIG. 29, a pair of through electrodes 82, 83 are formed to include the glass frit 6, the core portion 7 and the head portion 8.

Further, a single routing electrode 84 only is formed, and no routing electrode is formed on the one through electrode 82 side that is located directly below the base portion 12 of the piezoelectric vibrating reed 4. More specifically, the routing electrode 84 is formed such that after it is drawn from a position adjacent to the one through electrode 82 to the tip end side of the vibrating arm portions 10, 11 along the vibrating arm portions 10, 11, it is electrically connected to the head portion 8 of the other through electrode 83.

Further, the bumps B are respectively formed on a section of the routing electrode 84 that is adjacent to the one through electrode 82 and on the head portion 8 of the one through electrode 82.

Next, a manufacturing method for manufacturing the above-described piezoelectric vibrator 80 will be described. The processes up to and including the firing process (S39) are performed in a similar manner to the piezoelectric vibrator manufacturing method of the first embodiment.

Subsequent to the firing process, the polishing process is performed in which polishing is performed until the tip end of the core portion 7 is exposed to the lower surface 40b of the base substrate wafer 40 (S40). At this time, in the embodiment, the head portion 8 of the rivet 9 is left without being polished.

Then, the bonding film forming process (S41) and the processes from the routing electrode forming process (S42) onwards are performed in a similar manner to the piezoelectric vibrator manufacturing method of the first embodiment.

According to the above-described package 81 and the manufacturing method of the piezoelectric vibrator 80 including the package 81, it is possible to achieve operational effects similar to those of the first embodiment.

Further, since the head portion 8 of the rivet 9 is not polished in the polishing process, it is possible to further improve the production efficiency of the package 81.

(Oscillator)

Next, one embodiment of an oscillator according to the invention will be described with reference to FIG. 30.

Figure 30:
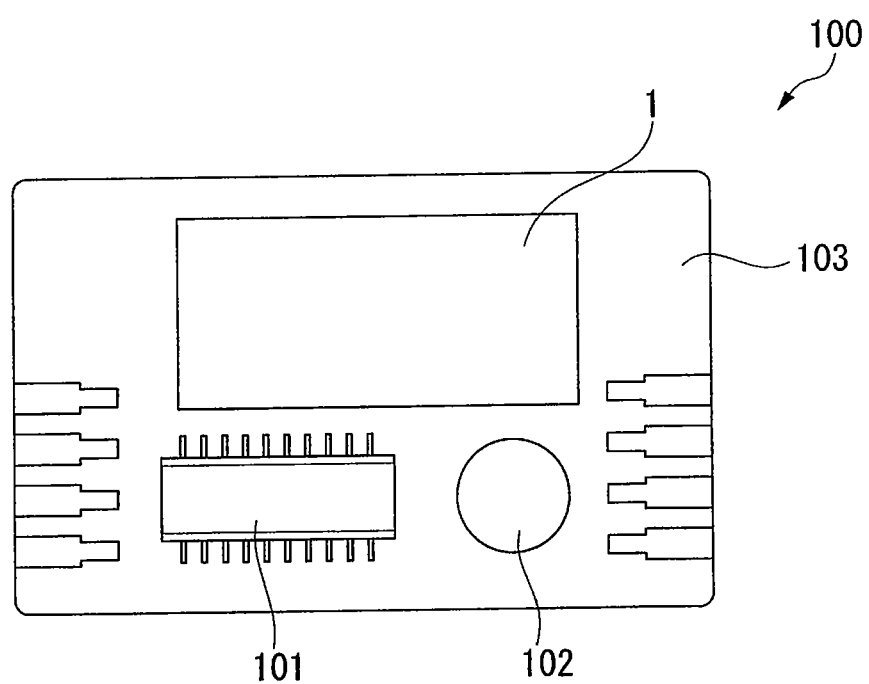
FIG. 30 is a structural view showing one embodiment of an oscillator according to the invention.

In an oscillator 100 of the embodiment, the piezoelectric vibrator 1 is formed as an oscillation element that is electrically connected to an integrated circuit 101 as shown in FIG. 30. Note that, in each embodiment to be described below, a case is described in which the piezoelectric vibrator 1 described in the first embodiment is used as a piezoelectric vibrator. However, even if the piezoelectric vibrator 80 described in the second embodiment is used, similar operational effects can be obtained.

The oscillator 100 is provided with a substrate 103 on which an electronic component 102 such as a capacitor is mounted. The above-described integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are respectively and electrically connected by wiring patterns, which are not shown in the drawings. Note that each of the structural components is molded by resin, which is not shown in the drawings.

In the oscillator 100 structured in this manner, when a voltage is applied to the piezoelectric vibrator 1, the piezoelectric vibrating reed 4 in the piezoelectric vibrator 1 vibrates. The vibration is converted to an electrical signal by a piezoelectric property of the piezoelectric vibrating reed 4, and input to the integrated circuit 101 as an electrical signal.

The input electrical signal is subjected to various types of processing by the integrated circuit 101 and is output as a frequency signal. Thus, the piezoelectric vibrator 1 functions as an oscillation element.

Further, by selectively setting the structure of the integrated circuit 101, for example, to an RTC (real time clock) module or the like in response to demand, in addition to a single-function oscillator for a timepiece and the like, it is possible to add a function of controlling an operation date or time of the device or an external device or a function of providing time or a calendar.

As described above, the oscillator 100 of the embodiment is provided with the high quality piezoelectric vibrator 1 in which airtightness in the cavity C is reliably ensured. Therefore, it is also possible to similarly improve the quality of the oscillator 100 itself In addition to this, stable and highly accurate frequency signals can be obtained over a long period of time.

(Electronic Device)

Figure 31:
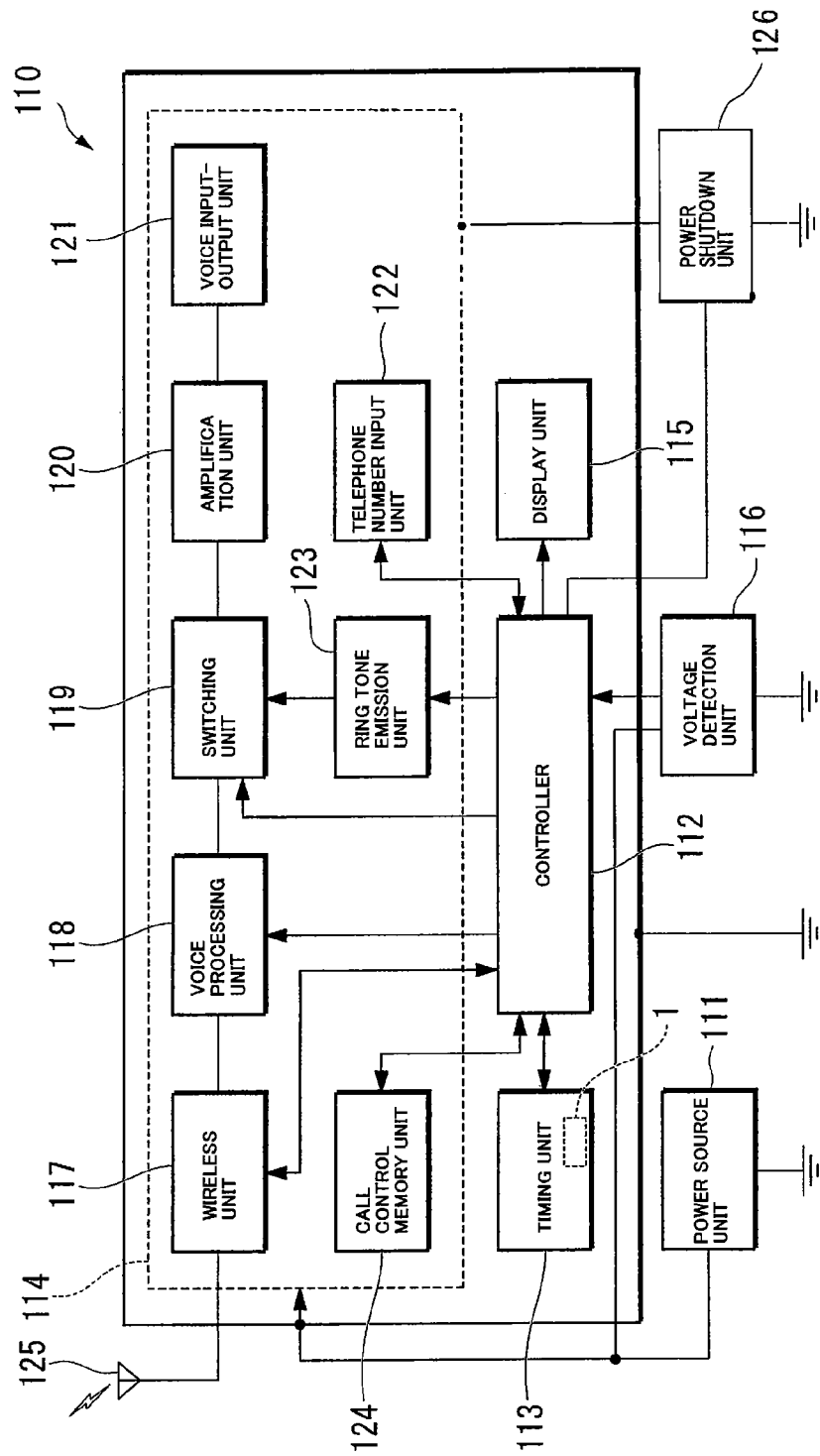
FIG. 31 is a structural view showing one embodiment of an electronic device according to the invention.

Next, one embodiment of an electronic device according to the invention will be described with reference to FIG. 31. Note that a portable information device 110 having the above-described piezoelectric vibrator 1 will be described as an example of the electronic device.

First, the portable information device 110 according to the embodiment is represented by a mobile phone, for example, and is made by developing and improving a wrist watch in related art. The external appearance is similar to the wrist watch, and a liquid crystal display is arranged in a section corresponding to a dial plate so that current time and the like can be displayed on its screen. When being used as a communication device, it can be removed from the wrist, and communication similar to a mobile phone of related art can be performed using a speaker and a microphone incorporated in an inner side section of a band. However, as compared to the mobile phone of the related art, it is dramatically compact and lightweight.

Next, the structure of the portable information device 110 of the embodiment will be described. As shown in FIG. 31, the portable information device 110 is provided with the piezoelectric vibrator 1 and a power supply portion 111 to supply electric power. The power supply portion 111 is formed by a lithium secondary battery, for example. A control portion 112 that performs various types of control, a time measuring portion 113 that counts time etc., a communication portion 114 that performs communication with the outside, a display portion 115 that displays various types of information, and a voltage detection portion 116 that detects a voltage of each of the functional portions are connected in parallel to the power supply portion 111. Electric power is supplied to each of the functional portions by the power supply portion 111.

The control portion 112 controls each of the functional portions and thereby performs operation control of the entire system, such as transmission and reception of audio data, measurement and display of current time, and the like. Further, the control portion 112 is provided with a ROM into which a program is written in advance, a CPU that reads and executes the program written into the ROM, a RAM that is used as a work area of the CPU, and the like.

The time measuring portion 113 is provided with an integrated circuit that incorporates an oscillation circuit, a register circuit, a counter circuit and an interface circuit etc., and the piezoelectric vibrator 1. When a voltage is applied to the piezoelectric vibrator 1, the piezoelectric vibrating reed 4 vibrates. The vibration is converted to an electrical signal due to piezoelectric property of crystal, and is input to the oscillation circuit as the electrical signal. The output of the oscillation circuit is binarized and counted by the register circuit and the counter circuit. Then, signal transmission and reception with the control portion 112 is performed via the interface circuit, and current time, current date or calendar information etc. is displayed on the display portion 115.

The communication portion 114 has similar functions to those of the mobile phone of the related art, and is provided with a wireless portion 117, an audio processing portion 118, a switching portion 119, an amplifier portion 120, an audio input/output portion 121, a telephone number input portion 122, a ring tone generation portion 123 and a call control memory portion 124.

The wireless portion 117 carries out transmission and reception of various types of data, such as audio data, with a base station via an antenna 125. The audio processing portion 118 encodes and decodes an audio signal input from the wireless portion 117 or the amplifier portion 120. The amplifier portion 120 amplifies a signal input from the audio processing portion 118 or the audio input/output portion 121 to a predetermined level. The audio input/output portion 121 is formed by a speaker, a microphone and the like, and makes a ring tone and incoming audio louder and collects audio.

The ring tone generation portion 123 generates a ring tone in response to a call from the base station. The switching portion 119 switches the amplifier portion 120 connected to the audio processing portion 118 to the ring tone generation portion 123 only when a call arrives, so that the ring tone generated in the ring tone generation portion 123 is output to the audio input/output portion 121 via the amplifier portion 120.

Note that the call control memory portion 124 stores a program relating to incoming and outgoing call control for communications. The telephone number input portion 122 includes, for example, numeric keys from 0 to 9 and other keys and the telephone number of a call destination is input by depressing these numeric keys and the like.

The voltage detection portion 116 detects a voltage drop and notifies the control portion 112 of it when a voltage applied by the power supply portion 111 to each of the functional portions, such as the control portion 112, drops below a predetermined value. The predetermined voltage value in this case is a value pre-set as the lowest voltage necessary to operate the communication portion 114 stably, and is, for example, about 3V. When receiving a notification of the voltage drop from the voltage detection portion 116, the control portion 112 disables operations of the wireless portion 117, the audio processing portion 118, the switching portion 119 and the ring tone generation portion 123. In particular, it is essential to stop the operation of the wireless portion 117 that consumes a large amount of electric power. Furthermore, a message informing that the communication portion 114 is unavailable due to insufficient battery power is displayed on the display portion 115.

More specifically, it is possible to disable the operation of the communication portion 114 by the voltage detection portion 116 and the control portion 112, and to display the notification message on the display portion 115. Although a character message may be used for this display, an x (cross) mark may be put on a telephone icon displayed on an upper section of a display screen of the display portion 115, as a more intuitive display.

Note that, by providing a power supply shutdown portion 126 that is capable of selectively shutting down the power supply to portions involved with the function of the communication portion 114, it is possible to stop the function of the communication portion 114 in a more reliable manner.

As described above, the portable information device 110 of the embodiment is provided with the high quality piezoelectric vibrator 1 in which airtightness in the cavity C is reliably ensured. Therefore, it is also possible to similarly improve the quality of the portable information device itself. In addition to this, it is possible to display stable and highly accurate timepiece information over a long period of time.

(Radio Timepiece)

Next, one embodiment of a radio timepiece according to the invention will be described with reference to FIG. 32.

Figure 32:
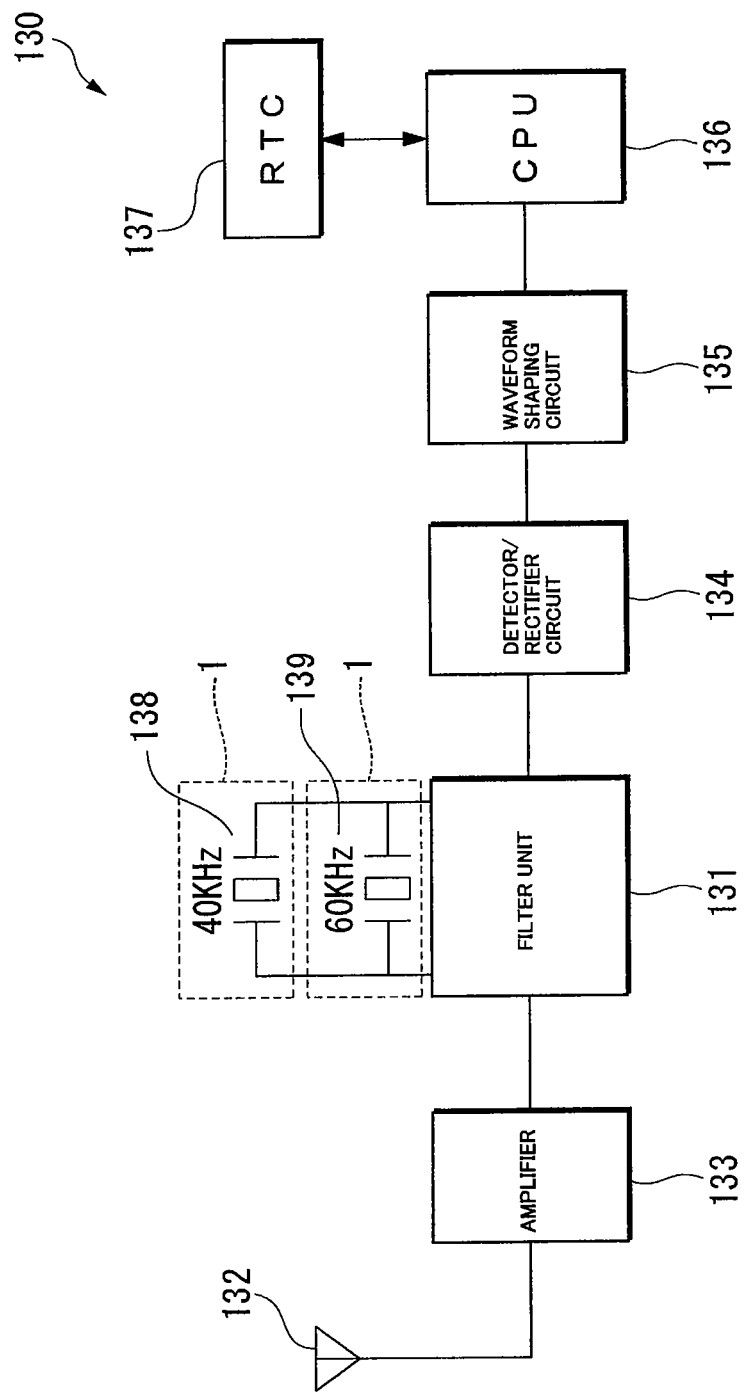
FIG. 32 is a structural view showing one embodiment of a radio timepiece according to the invention.

A radio timepiece 130 of the embodiment is provided with the piezoelectric vibrator 1 that is electrically connected to a filter portion 131 as shown in FIG. 32, and is a timepiece that has a function of receiving a standard wave including timepiece information, and a function of automatically correcting the standard wave to a correct time and displaying it.

In Japan, transmitting stations (transmitter stations) for transmitting standard waves are located in Fukushima prefecture (40 kHz) and Saga prefecture (60 kHz), and transmit standard waves, respectively. A long wave corresponding to 40 kHz or 60 kHz has a property of propagating on the ground surface and also has a property of propagating while being reflected by an ionized layer and the ground surface. Accordingly, the propagation range is wide and the above-mentioned two transmitting stations cover the entire area of Japan.

Hereinafter, a functional structure of the radio timepiece 130 will be described in detail.

An antenna 132 receives a standard wave that is a long wave of 40 kHz or 60 kHz. The standard wave, which is a long wave, is a wave that is obtained by performing AM modulation of time information, which is called a time code, on a carrier wave of 40 kHz or 60 kHz. The received standard wave, which is a long wave, is amplified by an amplifier 133, and is filtered and tuned by the filter portion 131 having a plurality of the piezoelectric vibrators 1.

The piezoelectric vibrators 1 of the embodiment are respectively provided with crystal oscillator portions 138, 139 having resonance frequencies of 40 kHz and 60 kHz, which are the same as the above-described carrier frequencies.

Further, the filtered signal with a predetermined frequency is detected and demodulated by a detection and rectification circuit 134. Then, the time code is taken out through a waveform shaping circuit 135 and is counted by a CPU 136. The CPU 136 reads information of a current year, cumulative days, a day of the week, a time of day, and the like. The read information is reflected on an RTC 137 and correct time information is displayed.

Since the carrier wave is 40 kHz or 60 kHz, the above-described oscillator having a tuning-fork type structure is preferably used as the crystal oscillator portions 138, 139.

Note that, although the above-described explanation is made using an example in Japan, the frequencies of long wave standard waves are different in overseas countries. For example, the standard wave with a frequency of 77.5 KHz is used in Germany. Accordingly, when the radio timepiece 130 that is also compatible in overseas countries is incorporated into a portable device, the piezoelectric vibrator 1 having a frequency different from the frequency used in Japan is further necessary.

As described above, the radio timepiece 130 of the embodiment is provided with the high quality piezoelectric vibrator 1 in which airtightness in the cavity C is reliably ensured. Therefore, it is also possible to similarly improve the quality of the radio timepiece 130 itself In addition to this, it is possible to count time stably and highly accurately over a long period of time.

Note that the technical scope of the invention is not limited to each of the above-described embodiments, and various types of modifications may be added within a scope that does not depart from the spirit of the invention.

For example, it is assumed that the gas relief passages 8a lead from the base end of the core portion 7 to the side surface of the head portion 8. However, without being limited to this, they may lead from the base end of the core portion 7 to a front surface of the head portion 8. In this case, for example, through holes that penetrate from the rear surface to the front surface of the head portion 8 may be formed as gas relief passages. Further, even when the gas relief passages lead from the base end of the core portion 7 to the side surface of the head portion 8, they are not limited to those described in each of the above-described embodiments.

Further, although in each of the above-described embodiments, the case is described in which the core portion 7 is formed in a column shape, it may have a prismatic shape. In this case as well, similar operational effects can be obtained.

Further, in each of the above-described embodiments, it is preferable to use, as the core portion 7, a material whose thermal expansion coefficient is substantially the same as those of the base substrate 2 (the base substrate wafer 40) and the glass frit 6. In this case, when firing is performed, the three members, i.e., the base substrate wafer 40, the glass frit 6 and the core portion 7, thermally expand respectively in a similar manner. Accordingly, there is no case in which an excessive pressure is applied to the base substrate wafer 40 and the glass frit 6 due to a difference in thermal expansion coefficients and cracks etc. are generated, or in which a gap is opened between the glass frit 6 and the through holes 30, 31 or between the glass frit 6 and the core portion 7. Therefore, the through electrodes 32, 33, 82, 83 with higher quality can be formed, and as a result, it is possible to further improve the quality of the piezoelectric vibrators 1, 80.

Further, in each of the above-described embodiments, as an example of the piezoelectric vibrating reed 4, the grooved piezoelectric vibrating reed 4 in which the groove portions 18 are formed on both sides of the vibrating arm portions 10, 11 is used in the explanation. However, a piezoelectric vibrating reed of a type that does not include the groove portions 18 may be used. However, by forming the groove portions 18, it is possible to improve electric field efficiency between the pair of excitation electrodes 15 when a predetermined voltage is applied to the pair of excitation electrodes 15. Therefore, it is possible to further suppress vibration loss and to further improve vibration characteristics. In other words, a crystal impedance (CI) value can be further reduced, and it is possible to further improve the quality of the piezoelectric vibrating reed 4. In this point of view, it is preferable to form the groove portions 18.

Further, although in each of the above-described embodiments, the tuning-fork type piezoelectric vibrating reed 4 is described as an example, the invention is not limited to the tuning-fork type. For example, a thickness shear vibrating reed may be used.

Further, although in each of the above-described embodiments, the base substrate 2 and the lid substrate 3 are anodically bonded together via the bonding film 35, the invention is not limited to anodic bonding. However, since the both substrates 2, 3 can be firmly bonded to each other by anodic bonding, this is preferable.

Further, although in each of the above-described embodiments, the piezoelectric vibrating reed 4 is bump bonded, the invention is not limited to bump bonding. The piezoelectric vibrating reed 4 may be bonded using a conductive adhesive, for example. However, by means of bump bonding, the piezoelectric vibrating reed 4 can be caused to float from the upper surface of the base substrate 2, and it is possible to naturally secure a minimum vibration gap that is necessary for vibration. Accordingly, it is preferable to use bump bonding.

Further, in each of the above-described embodiments, a description is given of a case in which the length of the core portion 7 is set to be 0.02 mm shorter than the thickness of the base substrate wafer 40 before the polishing process. However, the length can be set freely, and it is sufficient if the squeegee 45 and the core portion 7 do not come into contact with each other when the excess glass frit 6a is removed using the squeegee 45.

Further, although in each of the above-described embodiments, it is assumed that the rivet 9 is formed such that the tip end of the core portion 7 has a flat surface, the tip end need not necessarily have a flat surface.

Further, although in each of the above-described embodiments, it is assumed that the glass frit removing process is performed, the invention is not limited to this. For example, in the glass frit filling process, if the glass frit 6a in a paste form is filled into the through holes 30, 31 individually, instead of filling the glass frit 6a in a paste form onto the upper surface 40a of the base substrate wafer 40, the glass frit removing process may be omitted.

Further, in each of the above-described embodiments, the laminate material 70 having a size that covers the entire upper surface 40a of the base substrate wafer is adopted. However, as long as the laminate material 70 can be adhered such that it covers the head portion 8 of the rivet 9, the size of the laminate material 70 is not limited to that described in each of the above-described embodiments.

Further, in each of the above-described embodiments, it is assumed that the laminate material 70 is used and the laminate material adhering process and the laminate material peeling off process are respectively provided. However, without being limited to this, the laminate material 70 need not necessarily be used.

In addition, even when the laminate material 70 is used, as long as the laminate material 70 has elasticity and adhesiveness, it is not limited to that described in each of the above-described embodiments. Moreover, in each of the above-described embodiments, it is assumed that the laminate material peeling off process is performed after the pre-drying process. However, without being limited to this, for example, the pre-drying process need not necessarily be performed, or the laminate material peeling off process may be performed after the firing process.

Further, in each of the above-described embodiments, it is assumed that the two substrates, the base substrate 2 and the lid substrate 3, are laminated to form each of the packages 5, 81. However, without being limited to this, each of the packages 5, 81 may be formed by three or more substrates being laminated. In this case, for example, a flat plate-shaped base substrate and lid substrate, neither of which is formed with the above-described recessed portion, and a frame substrate having a through opening that forms an outer contour of the recessed portion in a plan view may be provided. The substrates may be laminated such that the frame substrate is sandwiched between the base substrate and the lid substrate, and the adjacent substrates may be bonded to each other. In other words, the packages 5, 81 need not be limited to that described in each of the above-described embodiments, as long as they include a plurality of substrates in which adjacent substrates are bonded to each other in a laminated state, and a cavity which is formed by being sandwiched by a pair of substrates of the plurality of substrates and which houses an object to be housed in an airtightly sealed state.

Further, in each of the above-described embodiments, it is assumed that each of the packages 5, 81 includes one pair of the through electrodes 32, 33, 82, 83. However, without being limited to this, the number of the through electrodes for one package may be one, or three or more.

Further, in each of the above-described embodiments, a description is given of a case in which the piezoelectric vibrator 1 or 80 is adopted in which the piezoelectric vibrating reed 4 is housed, as an object to be housed, in the cavity C of the package 5 or 81. However, the object to be housed is not limited to this, and it may be changed as appropriate.

Further, in each of the above-described embodiments, the substrates in a wafer state (the base substrate wafer 40 and the lid substrate wafer 50) are used to manufacture the plurality of piezoelectric vibrators 1 or 80 at one time. However, without being limited to this, substrates whose dimensions are matched to the outer shapes of the base substrate 2 and the lid substrate 3 may be formed in advance, and only one piezoelectric vibrator 1 or 80 may be manufactured at a time.

In addition to the above, the structural elements in the above-described embodiments can be replaced, as appropriate, with known structural elements without departing from the spirit of the invention, or the above-described modified examples may be combined as appropriate.

What is claimed is:

1. A package manufacturing method for manufacturing a package using a rivet having a flat plate-shaped head portion and a core portion protruding from a rear surface of the head portion, the package including a plurality of substrates in which adjacent substrates are bonded to each other in a laminated state, a cavity which is formed by being sandwiched by a pair of substrates of the plurality of substrates, and which houses an object to be housed in an airtightly sealed state, the core portion which is disposed in a through hole that penetrates a base substrate that is one of the pair of substrates, and which electrically connects the object to be housed with the outside, and a glass frit that is filled between the through hole and the core portion and is fired to form a seal between the through hole and the core portion, the package manufacturing method comprising:

a rivet disposing step of inserting the core portion into the through hole until the rear surface of the head portion comes into contact with a first surface of the base substrate, and disposing the rivet in the base substrate;

a glass frit filling step of filling the glass frit in a paste form between the through hole and the core portion, in the base substrate in which the rivet is disposed; and a firing step of integrally fixing the through hole, the rivet and the glass frit by firing the filled glass frit, and sealing between the through hole and the core portion;

wherein a gas relief passage, which leads from a base end of the core portion to one of a side surface and a front surface of the head portion, is formed on the rear surface of the head portion of the rivet.

2. The package manufacturing method according to claim 1, further comprising:

before the glass frit filling step, a laminate material adhering step of adhering a laminate material having elasticity and adhesiveness to the first surface so as to cover the head portion of the rivet disposed in the base substrate.

3. The package manufacturing method according to claim 2, wherein the laminate material includes
    a tape main body having elasticity, and
    a thermoplastic adhesive coated on the tape main body, and wherein
the package manufacturing method further comprises:
    before the firing step, a pre-drying step of pre-drying the glass frit by heating the filled glass frit at a temperature lower than that of the firing step; and
    between the pre-drying step and the firing step, a laminate material peeling off step of peeling off the laminate material from the base substrate.

4. The package manufacturing method according to claim 1, further comprising:
after the firing step, a polishing step of removing the head portion by polishing the first surface side of the base substrate, and exposing the core portion to the first surface of the base substrate.

5. A package manufactured by the package manufacturing method according to claim 1.

6. A piezoelectric vibrator comprising:
the package according to claim 5; and
a piezoelectric vibrating reed that is housed in the cavity, as the object to be housed.

7. An oscillator, wherein
the piezoelectric vibrator according to claim 6 is electrically connected to an integrated circuit, as an oscillation element.

8. An electronic device, wherein
the piezoelectric vibrator according to claim 6 is electrically connected to a time measuring portion.

9. A radio timepiece, wherein
the piezoelectric vibrator according to claim 6 is electrically connected to a filter portion.

10. A package comprising:
a plurality of substrates in which adjacent substrates are bonded to each other in a laminated state;
a cavity which is formed by being sandwiched by a pair of substrates of the plurality of substrates, and which houses an object to be housed in an airtightly sealed state;
a core portion which is disposed in a through hole that penetrates a base substrate that is one of the pair of substrates, and which electrically connects the object to be housed with the outside;
a flat plate portion that is connected to the core portion and is disposed in the cavity; and
a glass frit that is filled between the through hole and the core portion and is fired to form a seal between the through hole and the core portion;
wherein
the flat plate portion is disposed in the cavity so as to cover the through hole, and
the glass frit is exposed in the cavity.

* * * * *